(12) United States Patent
Chida

(10) Patent No.: US 8,563,397 B2
(45) Date of Patent: *Oct. 22, 2013

(54) SEMICONDUCTOR DEVICE AND MANUFACTURING METHOD THEREOF

(75) Inventor: Akihiro Chida, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 402 days.

This patent is subject to a terminal disclaimer.

(21) Appl. No.: 12/498,462

(22) Filed: Jul. 7, 2009

(65) Prior Publication Data

US 2010/0171221 A1    Jul. 8, 2010

(30) Foreign Application Priority Data

Jul. 9, 2008 (JP) ................................. 2008-179286

(51) Int. Cl.
*H01L 21/30* (2006.01)

(52) U.S. Cl.
USPC 438/455; 257/40; 257/E21.122; 257/E21.502

(58) Field of Classification Search
USPC ............. 438/82, 99, 106, 107, 149, 455, 456, 438/457, 458, 459; 257/40, E51.013, 257/E21.122, E21.502
See application file for complete search history.

(56) References Cited

U.S. PATENT DOCUMENTS

| | | | |
|---|---|---|---|
| 5,058,800 A * | 10/1991 | Yoshizawa et al. ...... 228/180.21 | |
| 5,075,166 A | 12/1991 | Sikorski et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 5,879,502 A | 3/1999 | Gustafson | |
| 5,888,609 A | 3/1999 | Karttunen et al. | |
| 6,114,005 A * | 9/2000 | Nagai et al. ................. | 428/114 |
| 6,224,965 B1 * | 5/2001 | Haas et al. ................... | 428/209 |

(Continued)

FOREIGN PATENT DOCUMENTS

| | | |
|---|---|---|
| EP | 1 092 739 | 4/2001 |
| EP | 1 589 797 | 10/2005 |

(Continued)

OTHER PUBLICATIONS

European Search Report (Application No. 09164841.0) Dated Apr. 2, 2013.

*Primary Examiner* — William D Coleman
*Assistant Examiner* — Su Kim
(74) *Attorney, Agent, or Firm* — Eric J. Robinson; Robinson Intellectual Property Law Office, P.C.

(57) ABSTRACT

The present invention relates to a semiconductor device and its manufacturing method including the steps of: forming a first semiconductor element layer having a first wiring over a substrate; forming a second semiconductor element layer having a second wiring and fixed to a first structure body having a first sheet-like fiber body, a first organic resin, and a first electrode; preparing a second structure body having a second sheet-like fiber body, a second organic resin which is not cured, and a second electrode; disposing the second structure body between the first and second semiconductor element layers so that the first wiring, the second electrode, and the second wiring are overlapped with each other over the substrate; and curing the second organic resin.

18 Claims, 16 Drawing Sheets

(56) References Cited

U.S. PATENT DOCUMENTS

| | | |
|---|---|---|
| 6,403,221 B1 | 6/2002 | Nakamura et al. |
| 6,476,330 B2 | 11/2002 | Otsuka et al. |
| 6,482,495 B1 * | 11/2002 | Kohama et al. .................. 428/67 |
| 6,530,147 B1 | 3/2003 | Haas et al. |
| 6,734,568 B2 | 5/2004 | Matsuo et al. |
| 6,805,958 B2 | 10/2004 | Nakamura et al. |
| 6,903,377 B2 | 6/2005 | Yamazaki et al. |
| 6,926,794 B2 | 8/2005 | Kohama et al. |
| 7,049,178 B2 | 5/2006 | Kim et al. |
| 7,061,083 B1 | 6/2006 | Usami et al. |
| 7,067,392 B2 | 6/2006 | Yamazaki et al. |
| 7,224,046 B2 * | 5/2007 | Abe et al. ...................... 257/668 |
| 7,262,464 B2 | 8/2007 | Takafuji et al. |
| 7,465,674 B2 | 12/2008 | Tamura et al. |
| 7,485,489 B2 | 2/2009 | Björbell |
| 7,495,256 B2 | 2/2009 | Yamazaki et al. |
| 7,700,463 B2 | 4/2010 | Shimomura |
| 7,727,859 B2 | 6/2010 | Watanabe et al. |
| 7,736,958 B2 * | 6/2010 | Dozen et al. .................. 438/155 |
| 7,736,964 B2 | 6/2010 | Yamamoto et al. |
| 7,785,933 B2 * | 8/2010 | Dozen et al. .................. 438/127 |
| 7,883,939 B2 * | 2/2011 | Chida ........................... 438/109 |
| 7,888,163 B2 | 2/2011 | Chida et al. |
| 2003/0032210 A1 | 2/2003 | Takayama et al. |
| 2004/0016118 A1 * | 1/2004 | Haas et al. ...................... 29/852 |
| 2004/0020046 A1 | 2/2004 | Suzuki et al. |
| 2005/0181601 A1 | 8/2005 | Tomoda et al. |
| 2005/0233122 A1 | 10/2005 | Nishimura et al. |
| 2006/0105153 A1 | 5/2006 | Jang et al. |
| 2006/0281235 A1 | 12/2006 | Tayanaka |
| 2007/0020932 A1 | 1/2007 | Maruyama et al. |
| 2007/0278563 A1 | 12/2007 | Takano et al. |
| 2008/0012126 A1 | 1/2008 | Dozen et al. |
| 2008/0044940 A1 | 2/2008 | Watanabe et al. |
| 2008/0083954 A1 | 4/2008 | Tokunaga |
| 2008/0182349 A1 | 7/2008 | Yamazaki et al. |
| 2008/0224940 A1 | 9/2008 | Sugiyama et al. |
| 2008/0224941 A1 | 9/2008 | Sugiyama et al. |
| 2008/0242005 A1 | 10/2008 | Dozen et al. |
| 2008/0311706 A1 * | 12/2008 | Dozen et al. .................. 438/127 |
| 2009/0065590 A1 | 3/2009 | Aoki et al. |
| 2009/0302457 A1 | 12/2009 | Chida et al. |
| 2009/0314527 A1 | 12/2009 | Hatano et al. |
| 2011/0024853 A1 | 2/2011 | Sugiyama et al. |

FOREIGN PATENT DOCUMENTS

| | | | |
|---|---|---|---|
| JP | 05-190582 | | 7/1993 |
| JP | 05-286065 | | 11/1993 |
| JP | 07-007246 | | 1/1995 |
| JP | 10-092980 | | 4/1998 |
| JP | 11-017348 A | | 1/1999 |
| JP | 2002-232152 | * | 8/2001 |
| JP | 2001-308540 A | | 11/2001 |
| JP | 2001-331120 | | 11/2001 |
| JP | 2002-064178 A | | 2/2002 |
| JP | 2002-198658 | | 7/2002 |
| JP | 2003-049388 | | 2/2003 |
| JP | 2003-174141 A | | 6/2003 |
| JP | 2004-078991 | | 3/2004 |
| JP | 2004-362341 | | 12/2004 |
| JP | 2007-091822 | | 4/2007 |
| JP | 2008-112988 | | 5/2008 |
| WO | WO 96/09158 | | 3/1996 |
| WO | WO 01/01740 | | 1/2001 |
| WO | WO 2004/001848 | | 12/2003 |
| WO | WO 2008/041716 | | 4/2008 |

* cited by examiner

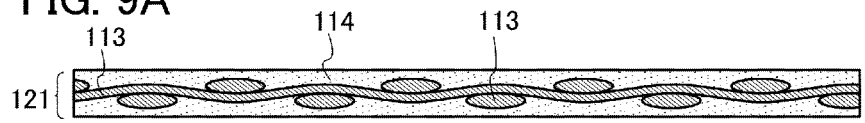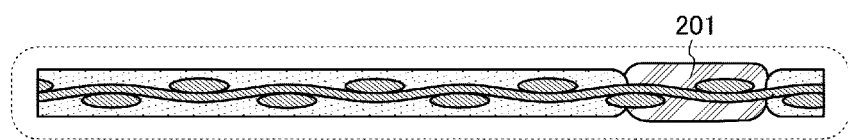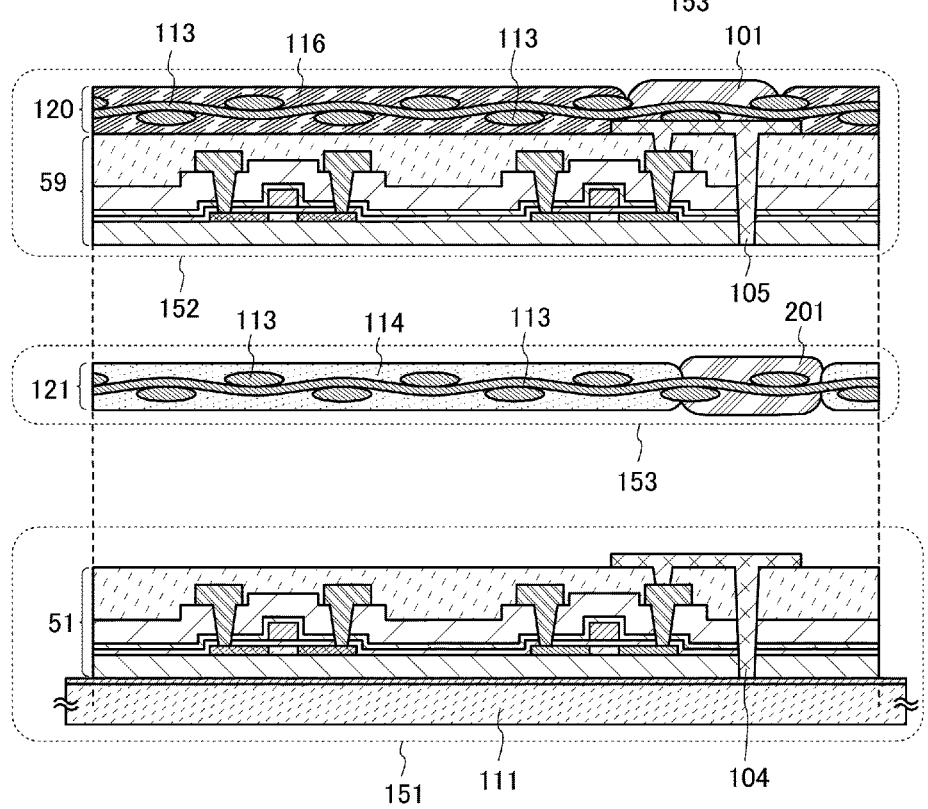

SEMICONDUCTOR DEVICE AND MANUFACTURING METHOD THEREOF

BACKGROUND OF THE INVENTION

1. Field of the Invention

The present invention relates to a semiconductor device and a manufacturing method thereof 2. Description of the Related Art As for a semiconductor integrated circuit that is expected to be further downsized and thinned, it is important to increase the strength of the semiconductor integrated circuit against external stress.

A prepreg is known, in which a combination of an organic resin and a sheet-like fiber body, for example glass cloth, is used (see Patent Document 1: Japanese Published Patent Application No. 2002-198658).

A multilayer semiconductor integrated circuit enables higher integration without increasing the area.

By using a prepreg, which is strong enough to be used as a protection material, semiconductor element layers in a semiconductor integrated circuit can be prevented from being physically broken even when such a highly integrated semiconductor integrated circuit is manufactured.

However, in the case where a semiconductor integrated circuit has still more layers, it is necessary to manufacture a wiring which electrically connects a plurality of semiconductor integrated circuits. For this, a through-hole penetrating the inside of the prepreg has to be made in order to form a wiring in the through-hole.

Forming the through-hole in the prepreg means that a fiber body is damaged; that is, there is a possibility that the strength of the prepreg is reduced.

Further, the number of manufacturing steps is increased because a hole has to be made in either the fiber body or the organic resin.

Furthermore, when semiconductor integrated circuits each covered with a prepreg are superposed on one another in order to achieve high integration, bending or warpage may occur because the semiconductor integrated circuit covered with a prepreg is soft. Therefore, there is a possibility that it is difficult to perform alignment for bonding the semiconductor integrated circuits.

SUMMARY OF THE INVENTION

It is an object of the present invention disclosed in this specification to improve the accuracy of alignment in bonding semiconductor integrated circuits each of which is covered with a prepreg.

It is another object of the present invention disclosed in this specification to form a conductive region in a prepreg while the strength of a fiber body is kept.

Semiconductor integrated circuits each of which is covered with a prepreg are superposed on one another. At that time, the semiconductor integrated circuits are superposed on each other with a prepreg including an organic resin which is not cured interposed therebetween. Since the organic resin which is not cured is cured by heating, the semiconductor integrated circuits each of which is covered with a prepreg can be bonded so as to be arranged one above the other. Thus, high integration can be achieved.

By disposing a conductive resin, for example metal-containing paste, on a prepreg in which an organic resin is not cured, the organic resin reacts with paste in the metal-containing paste. Accordingly, the organic resin is dissolved, and metal particles in the metal-containing paste penetrate into the dissolved portion. The metal particles move in interstices in a fiber body; thus, a conductive region which electrically connects a surface of the prepreg and a rear surface thereof is formed.

A conductive region is formed in advance in a prepreg in which an organic resin is not cured, and a semiconductor integrated circuit covered with a prepreg is bonded to another semiconductor integrated circuit with the conductive region interposed therebetween. Thus, the semiconductor integrated circuits can be electrically connected to each other.

Further, a semiconductor integrated circuit covered with a prepreg is formed over a substrate; a prepreg in which an organic resin is not cured is disposed thereover; another semiconductor integrated circuit covered with a prepreg is disposed thereover; and the organic resin which is not cured is cured for bonding. In that case, the accuracy of alignment can be improved simply by superposing prepregs over a substrate.

The present invention relates to a method for manufacturing a semiconductor device including the steps of: manufacturing a first semiconductor circuit element having: over a substrate, a first semiconductor element layer electrically connected to a first wiring (bump), over the first semiconductor element layer, a first structure body having a first sheet-like fiber body and a first organic resin which is cured, and a first through electrode which penetrates into the first structure body and is electrically connected to the first wiring; manufacturing a second semiconductor circuit element having: a second semiconductor element layer electrically connected to a second wiring (bump), over the second semiconductor element layer, a second structure body having a second sheet-like fiber body and a second organic resin which is cured, and a second through electrode which penetrates into the second structure body and is electrically connected to the second wiring; forming a third structure body having a third sheet-like fiber body and a third organic resin which is not cured; disposing a conductive resin having metal particles over the third organic resin which is not cured; manufacturing a fixing sheet provided with a third through electrode which penetrates into the third structure body, wherein the third organic resin which is not cured is dissolved by the conductive resin and the metal particles move in interstices in the third sheet-like fiber body; disposing the first semiconductor circuit element, the fixing sheet, and the second semiconductor circuit element so that the first through electrode, the third through electrode, and the second wiring are superposed on one another over the substrate; fixing the first semiconductor circuit element, the fixing sheet, and the second semiconductor circuit element by curing the third organic resin which is not cured of the fixing sheet; and separating the substrate from the first semiconductor circuit element, the fixing sheet, and the second semiconductor circuit element which are fixed.

The present invention further relates to a method for manufacturing a semiconductor device comprising the steps of: forming a first semiconductor element layer electrically connected to a first wiring (bump); over the first semiconductor element layer, forming a first structure body including a first sheet-like fiber body and a first organic resin which is not cured; disposing a first conductive resin having metal particles over the first organic resin which is not cured, thereby forming a first through electrode which penetrates into the first structure body and is electrically connected to the first wiring, wherein the first organic resin which is not cured is dissolved by the first conductive resin and the metal particles move in interstices in the first sheet-like fiber body; manufacturing a first semiconductor circuit element in which the first structure body is fixed to the first semiconductor element layer by curing the first organic resin which is not cured; over a second semiconductor element layer electrically connected to a second wiring (bump), forming a second structure body including a second sheet-like fiber body and a second organic resin which is not cured; over the second organic resin which is not cured, disposing a second conductive resin having metal particles, thereby forming a second through electrode which penetrates into the second structure body and is electrically connected to the second wiring, wherein the second organic resin which is not cured is dissolved by the second conductive resin and the metal particles move in interstices in the second sheet-like fiber body; manufacturing a second semiconductor circuit element in which the second structure body is fixed to the second semiconductor element layer by curing the second organic resin; forming a third structure body having a third sheet-like fiber body and a third organic resin which is not cured; disposing a third conductive resin having metal particles over the third organic resin which is not cured; manufacturing a fixing sheet provided with a third through electrode which penetrates into the third structure body, wherein the third organic resin which is not cured is dissolved by the third conductive resin and the metal particles move in interstices in the third sheet-like fiber body; disposing the first semiconductor circuit element, the fixing sheet, and the second semiconductor circuit element so that the first through electrode, the third through electrode, and the second wiring are superposed on one another over the substrate; fixing the first semiconductor circuit element, the fixing sheet, and the second semiconductor circuit element by curing the third organic resin which is not cured of the fixing sheet; and separating the substrate from the first semiconductor circuit element, the fixing sheet, and the second semiconductor circuit element which are fixed.

The metal particle includes any of copper (Cu), silver (Ag), nickel (Ni), gold (Au), platinum (Pt), palladium (Pd), tantalum (Ta), molybdenum (Mo), or titanium (Ti).

The first sheet-like fiber body, the second sheet-like fiber body, and the third sheet-like fiber body each include glass fiber.

The present invention further relates to a semiconductor device including a structure body having a through electrode, a sheet-like fiber body, and an organic resin; a first semiconductor element layer being in contact with the through electrode at a first surface thereof and having a first electrode which is exposed at a second surface opposite to the first surface of the first semiconductor element layer; and a second semiconductor element layer being in contact with the through electrode at a first surface thereof and having a second electrode which is exposed at a second surface opposite to the first surface of the second semiconductor element layer. In the semiconductor device, the structure body having the through electrode is located between the first semiconductor element layer and the second semiconductor element layer, and the through electrode electrically connects the first electrode and the second electrode.

The through electrode includes any of copper (Cu), silver (Ag), nickel (Ni), gold (Au), platinum (Pt), palladium (Pd), tantalum (Ta), molybdenum (Mo), or titanium (Ti).

The sheet-like fiber body includes glass fiber.

A semiconductor integrated circuit for which alignment is performed with improved accuracy and which is highly integrated can be obtained.

In addition, a through electrode can be provided without breaking a fiber body of a prepreg. Therefore, mechanical strength can be kept and a semiconductor integrated circuit which is strong can be obtained.

Further, an organic resin in a prepreg is used as a fixing material of a plurality of semiconductor elements. Therefore, even when a plurality of semiconductor elements is highly integrated to manufacture a semiconductor device, the thickness of the semiconductor device can be made small.

BRIEF DESCRIPTION OF THE DRAWINGS

FIGS. 9A to 9D are cross-sectional views illustrating a manufacturing process of a semiconductor circuit element.

DETAILED DESCRIPTION OF THE INVENTION

Figure 1A:
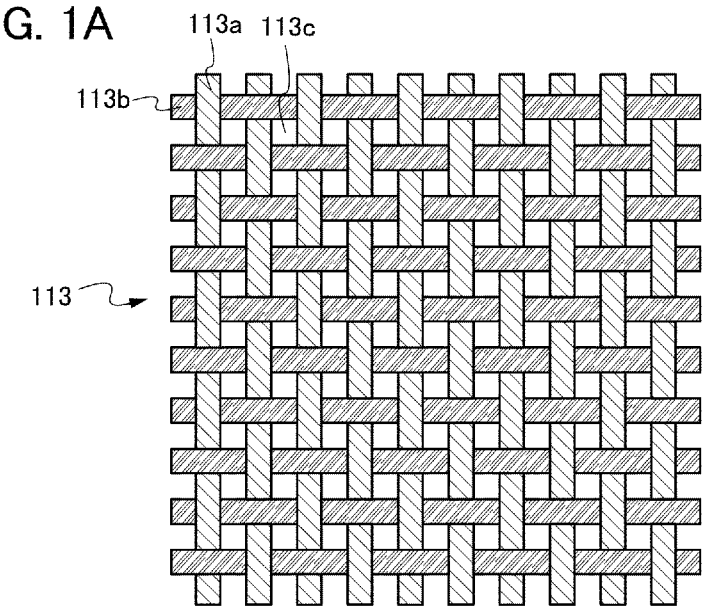
FIGS. 1A and 1B are top views of sheet-like fiber bodies.

Embodiments of the present invention will be described with reference to drawings. However, the present invention can be implemented in various different modes, and it is easily understood by those skilled in the art that various changes and modifications of the modes and details are possible without departing from the purpose and scope of the present invention. Therefore, the present invention is not construed as being limited to the description of the following Embodiments. It is to be noted that the same portion or a portion having the same function is denoted by the same reference numeral in all drawings for explaining Embodiments, and the repetitive explanation thereof is omitted.

Note that in this specification, a semiconductor device refers to elements and devices in general which function by utilizing a semiconductor. An electric device including an electric circuit, a liquid crystal display device, a light-emitting device, or the like and an electronic appliance mounted with the electric device are included in the category of semiconductor devices.

Embodiment 1

This embodiment is described with reference to FIGS. 1A and 1B, FIG. 2, FIG. 3, FIGS. 4A to 4D, FIGS. 5A and 5B, FIGS. 6A to 6D, FIGS. 7A to 7E, FIGS. 8A to 8D, FIGS. 9A to 9D, FIGS. 10A and 10B, FIGS. 11A and 11B, FIGS. 12A and 12B, FIG. 13, FIGS. 14A and 14B, FIGS. 15A and 15B, and FIG. 16.

First, a structure body (also referred to as a "prepreg") 120 having a sheet-like fiber body 113 and an organic resin 114 is described with reference to FIGS. 1A and 1B, FIG. 2, FIG. 3, and FIGS. 5A and 5B.

Figure 1B:
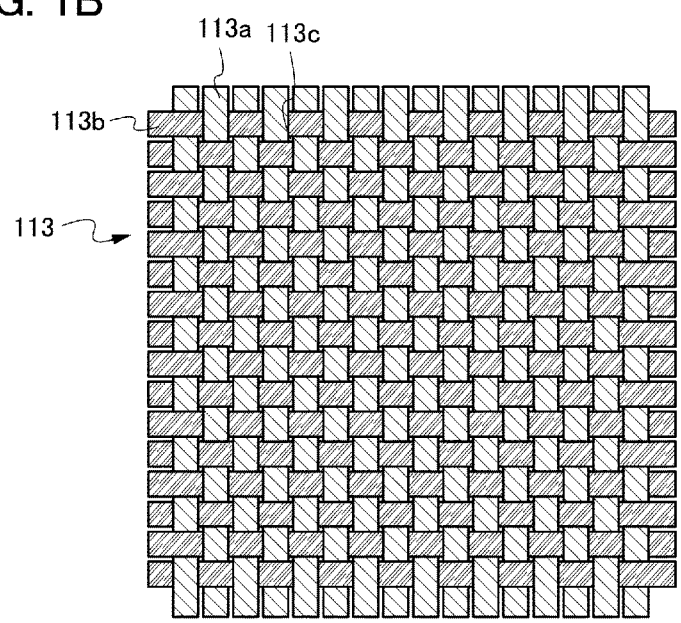
Figure 5A:
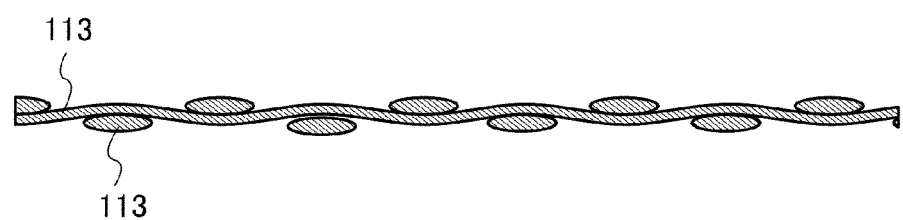
FIGS. 5A and 5B are cross-sectional views illustrating a manufacturing process of a structure body.
Figure 5B:
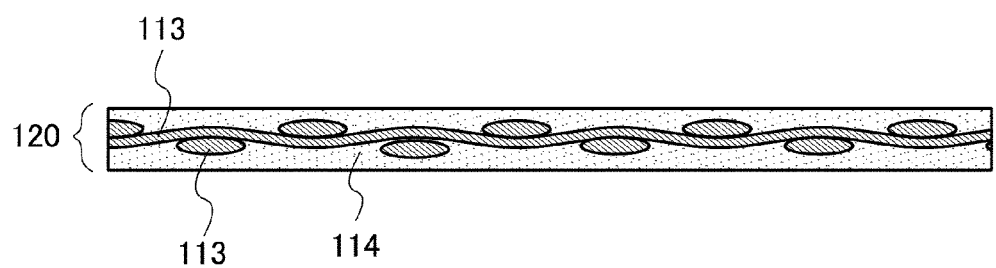

FIGS. 1A and 1B are top views of the sheet-like fiber body 113 which is a woven fabric which is woven using a yarn bundle as a warp yarn and a weft yarn. FIG. 5A is a cross-sectional view of the sheet-like fiber body 113. FIG. 5B is a cross-sectional view of the structure body 120 in which the sheet-like fiber body 113 is impregnated with the organic resin 114.

The sheet-like fiber body 113 is a woven fabric or a non-woven fabric of an organic compound or an inorganic compound. Further, a high-strength fiber of an organic compound or an inorganic compound may be used as the sheet-like fiber body 113.

Alternatively, the sheet-like fiber body 113 may be formed using a woven fabric woven using bundles of fibers (single yarns) (hereinafter also referred to as fiber bundles) for the warp yarn and the weft yarn, or a nonwoven fabric obtained by stacking bundles of plural kinds of fibers in a random manner or in one direction. In the case of a woven fabric, a plain-woven fabric, a twilled fabric, a satin-woven fabric, or the like can be used as appropriate.

The yarn bundle may have a circular shape or an elliptical shape in its cross section. As the yarn bundle, a yarn bundle may be used which has been subjected to fiber opening with a high-pressure water stream, high-frequency vibration using liquid as a medium, continuous ultrasonic vibration, pressing with a roll, or the like. A yarn bundle which is subjected to fabric opening has a large width, can reduce the number of single yarns in the thickness direction, and has an elliptical shape or a flat shape in its cross section. Further, by using a loosely twisted yarn as the yarn bundle, the yarn bundle is easily flattened and has an elliptical shape or a flat shape in its cross section. Using a yarn bundle having an elliptical shape or a flat shape in its cross section in this manner can make the thickness of the sheet-like fiber body 113 small. Accordingly, the thickness of the structure body 120 can be made small, so that a thin semiconductor device can be manufactured.

As shown in FIG. 1A, the sheet-like fiber body 113 is woven using warp yarns 113a spaced at regular intervals and weft yarns 113b spaced at regular intervals. Such a fiber body has regions without the warp yarns 113a and the weft yarns 113b (hereinafter, such regions are referred to as basket holes 113c). In such a sheet-like fiber body 113, the fiber body is further impregnated with the organic resin 114, whereby adhesion of the sheet-like fiber body 113 can be further increased.

As shown in FIG. 1B, in the sheet-like fiber body 113, density of the warp yarns 113a and the weft yarns 113b may be high and the proportion of the basket holes 113c may be low. Typically, the size of the basket hole 113c is preferably smaller than the area of a locally pressed portion. More typically, the basket hole 113c preferably has a rectangular shape having a side with a length greater than or equal to 0.01 mm and less than or equal to 0.2 mm. When the basket hole 113c of the sheet-like fiber body 113 has such a small area, even when pressure is applied by a member with a sharp tip (typically, a writing material such as a pen or a pencil), the pressure can be absorbed in the entire sheet-like fiber body 113.

Further, in order to enhance permeability of the organic resin 114 into the inside of the yarn bundle, the yarn bundle may be subjected to surface treatment. For example, as the surface treatment, corona discharge, plasma discharge, and the like for activating a surface of the yarn bundle are given. Further, as the surface treatment, surface treatment using a silane coupling agent or a titanate coupling agent is given.

A high-strength fiber is, specifically, a fiber with high modulus of elasticity in tension or a fiber with a high Young's modulus. As typical examples of a high-strength fiber, polyvinyl alcohol fiber, polyester fiber, polyamide fiber, polyethylene fiber, aramid fiber, polyparaphenylene benzobisoxazole fiber, glass fiber, carbon fiber, and the like can be given. As the glass fiber, glass fiber using E glass, S glass, D glass, Q glass, or the like can be used. Note that the sheet-like fiber body 113 may be formed from one or more kinds of the above-described high-strength fiber.

As the organic resin 114 with which the sheet-like fiber body 113 is impregnated, a thermosetting resin such as an epoxy resin, an unsaturated polyester resin, a polyimide resin, a bismaleimide-triazine resin, or a cyanate resin can be used. Further, a thermoplastic resin such as a polyphenylene oxide resin, a polyetherimide resin, or a fluorine resin can be used. Furthermore, a plurality of the above-described thermosetting resin and thermoplastic resin may be used. By using the above-described organic resin, the sheet-like fiber body can be fixed to a semiconductor element layer by heat treatment. The higher the glass transition temperature of the organic resin 114 is, the harder the organic resin 114 is broken by local pressure, which is preferable.

A highly thermally-conductive filler may be dispersed in the organic resin 114 or in the yarn bundles of fibers. As the highly thermally-conductive filler, aluminum nitride, boron nitride, silicon nitride, alumina, and the like are given. Further, as the highly thermally-conductive filler, metal particles of silver and copper are given. By including a highly thermally-conductive filler in an organic resin or in a yarn bundle, heat generated in an element layer can be easily released to the outside. Accordingly, thermal storage in the semiconductor device can be suppressed, and breaking of the semiconductor device can be suppressed.

Figure 2:
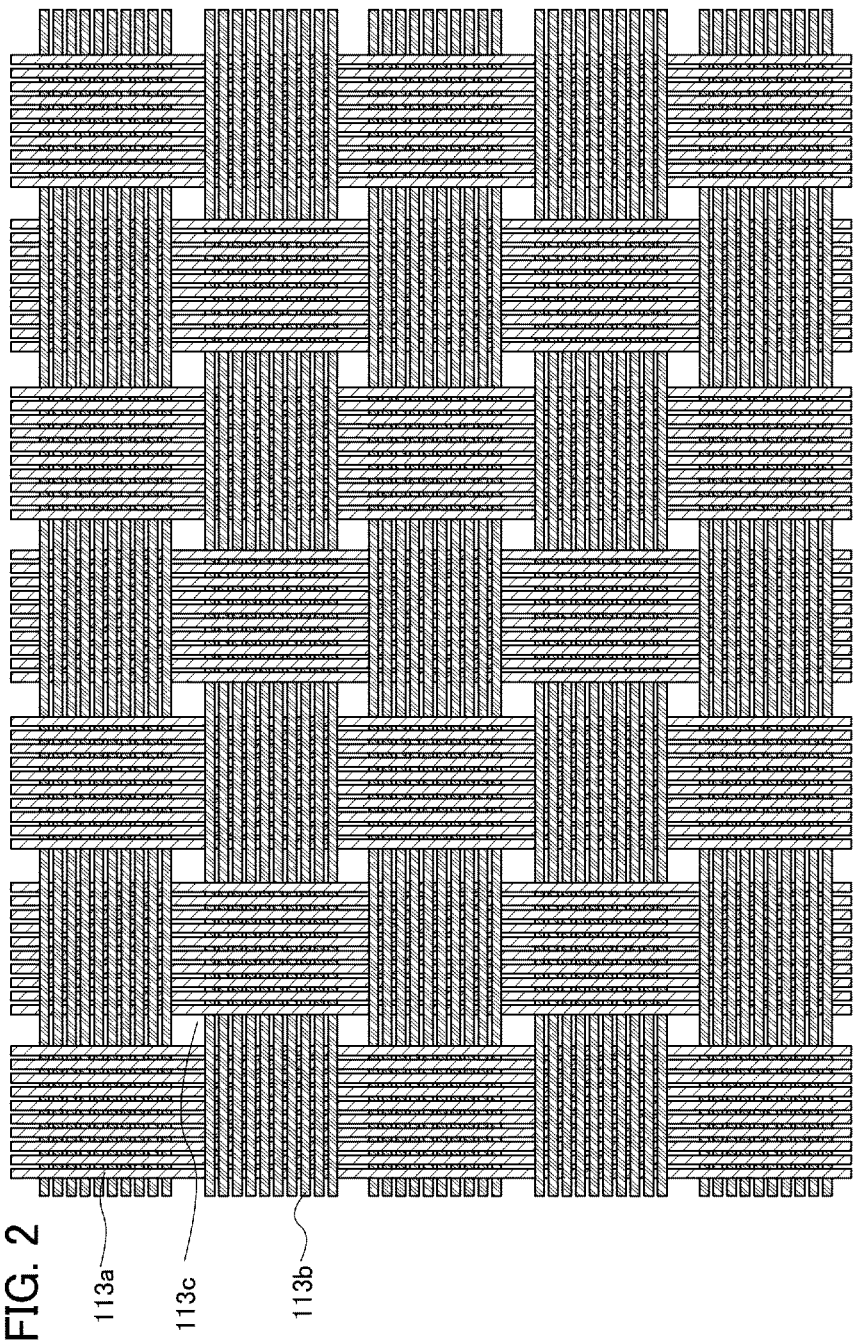
FIG. 2 is a top view of a sheet-like fiber body.
Figure 3:
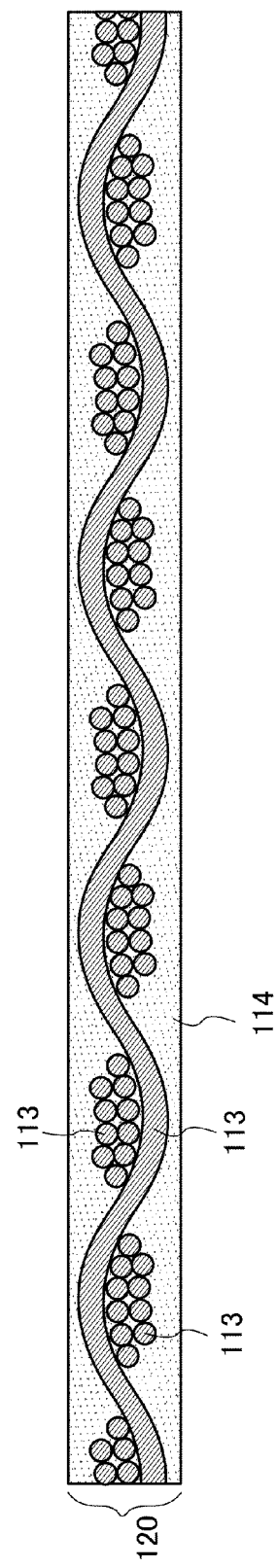
FIG. 3 is a cross-sectional view of a sheet-like fiber body.

FIGS. 1A and 1B show a sheet-like fiber body formed by weaving using one warp yarn and one weft yarn. However, the number of warp yarns and weft yarns is not limited to this. The number of warp yarns and weft yarns may be determined as needed. For example, FIG. 2 is a top view of a sheet-like fiber body and FIG. 3 is a cross-sectional view of the sheet-like fiber body. The sheet-like fiber body is formed by weaving using 10 warp yarns as one bundle and using 10 weft yarns as one bundle. In FIG. 3, the sheet-like fiber body 113 is impregnated with the organic resin 114 to form the structure body 120.

FIGS. 4A to 4D are cross-sectional views of a semiconductor element layer.

Figure 4A:
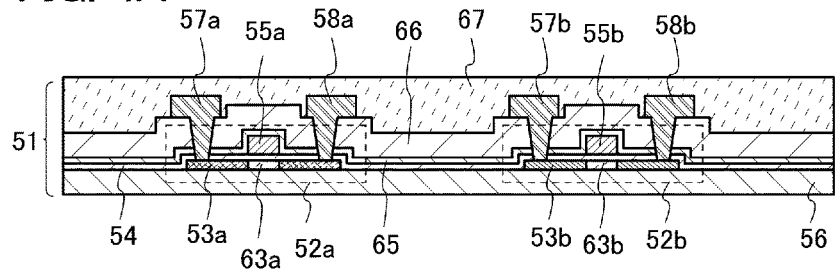
FIGS. 4A to 4D are cross-sectional views of semiconductor element layers.

In FIG. 4A, a semiconductor element layer 51 includes, over an insulating film 56, a thin film transistor 52a, a thin film transistor 52b, an insulating film 65, an insulating film 66, and an insulating film 67. The thin film transistor 52a includes a semiconductor layer having impurity regions 53a which are a source region and a drain region and a channel formation region 63a; a gate insulating film 54; and a gate electrode 55a. The thin film transistor 52b includes a semiconductor layer having impurity regions 53b which are a source region and a drain region and a channel formation region 63b; the gate insulating film 54; and a gate electrode 55b.

In each of the impurity regions 53a of the thin film transistor 52a and the impurity regions 53b of the thin film transistor 52b, an impurity element imparting one conductivity type is included. As an impurity element imparting n-type conductivity, phosphorus (P), arsenic (As), or the like is used. As an impurity element imparting p-type conductivity, boron (B) or the like is used. Impurity elements imparting n-type and/or p-type conductivity may be included in the impurity regions 53a and the impurity regions 53b. In this embodiment, the impurity regions 53a are n-type impurity regions because phosphorus (P) is included, and the impurity regions 53b are p-type impurity regions because boron (B) is included. That is, the thin film transistor 52a is an n-channel thin film transistor and the thin film transistor 52b is a p-channel thin film transistor.

The semiconductor layer of each of the thin film transistor 52a and the thin film transistor 52b is a layer formed of a non-single-crystal semiconductor to be greater than or equal to 10 nm and less than or equal to 100 nm in thickness, more preferably greater than or equal to 20 nm and less than or equal to 70 nm in thickness. As the non-single-crystal semiconductor layer, a crystalline semiconductor layer, an amorphous semiconductor layer, a microcrystalline semiconductor layer, and the like are given. As the semiconductor, silicon, germanium, a silicon germanium compound, and the like are given. In particular, it is preferable to apply a crystalline semiconductor which is formed by crystallization through rapid thermal annealing (RTA) or thermal treatment using an annealing furnace, or a crystalline semiconductor which is formed by crystallization through heat treatment and laser beam irradiation. In the heat treatment, a crystallization method using a metal element such as nickel which can promote crystallization of a silicon semiconductor can be used.

In the case of performing crystallization by laser light irradiation in addition to heat treatment, crystallization can be performed by continuously moving a melted zone of the crystalline semiconductor, which is melted by irradiation with a continuous wave laser beam or a high-repetition-rate ultrashort pulsed laser beam having a repetition rate of 10 MHz or higher and a pulse width of 1 nanosecond or shorter, preferably in the range of 1 to 100 picoseconds inclusive, along the laser beam irradiation direction. By using such a crystallization method, a crystalline semiconductor having a large grain diameter with a crystal grain boundary extending in one direction can be obtained.

The gate insulating film 54 is formed from an inorganic insulator such as silicon oxide or silicon oxynitride with a thickness greater than or equal to 5 nm and less than or equal to 50 nm, preferably greater than or equal to 10 nm and less than or equal to 40 nm.

The gate electrode 55a and the gate electrode 55b can be formed using metal, or a polycrystalline semiconductor to which an impurity imparting one conductivity type is added. When using metal, tungsten (W), molybdenum (Mo), titanium (Ti), tantalum (Ta), aluminum (Al), or the like can be used. Moreover, metal nitride obtained by nitriding metal can be used. Alternatively, a structure in which a first layer including the metal nitride and a second layer including the metal are stacked may be employed. At this time, by forming the first layer with metal nitride, the first layer can serve as a barrier metal. In other words, the metal of the second layer can be prevented from diffusing into the gate insulating layer or into the semiconductor layer that is provided below the gate insulating layer. In the case of employing a stacked-layer structure, the gate electrode may have a shape in which the edge of the first layer extends beyond the edge of the second layer.

The thin film transistor 52a and the thin film transistor 52b which are formed by combination of the semiconductor layer, the gate insulating film 54, the gate electrode 55a, the gate electrode 55b, and the like can have a variety of structures such as a single-drain structure, a lightly doped drain (LDD) structure, and a gate overlapped drain structure. Here, a thin film transistor having a single-drain structure is described. Alternatively, the thin film transistor can have a multigate structure which is equivalent to a plurality of transistors connected in series, to which the same gate voltage is applied, a dual gate structure where a semiconductor layer is interposed between gate electrodes, an inverted staggered structure where a gate electrode is formed over the insulating film 56 and a gate insulating layer and a semiconductor layer are formed over the gate electrode, or the like.

Wirings 57a and 58a and wirings 57b and 58b which are in contact with the impurity regions 53a and the impurity regions 53b which are a source region and a drain region, respectively, are preferably formed by combination of a low-resistance material such as aluminum (Al) and a barrier metal using a high-melting-point metal material such as titanium (Ti) or molybdenum (Mo), e.g., a stacked-layer structure of titanium (Ti) and aluminum (Al) or a stacked-layer structure of molybdenum (Mo) and aluminum (Al).

As the thin film transistor, a thin film transistor using metal oxide or an organic semiconductor material for a semiconductor layer can be used. As typical examples of the metal oxide, zinc oxide, oxide of zinc gallium indium, and the like are given.

A typical example of a semiconductor device including the semiconductor element layer 51 is a microprocessor (MPU) which controls another device or performs calculation and processing of data. An MPU includes a CPU, a main memory, a controller, an interface, an I/O port, and the like. These can be formed using a thin film transistor, a resistor, a capacitor, a wiring, and the like.

Further, as the semiconductor element layer 51, a driving device of a liquid crystal display device, a driving device of an EL display device, and a driving circuit of an electrophoresis device are given. These can be formed using a thin film transistor, a resistor, a capacitor, a wiring, and the like.

Figure 4B:
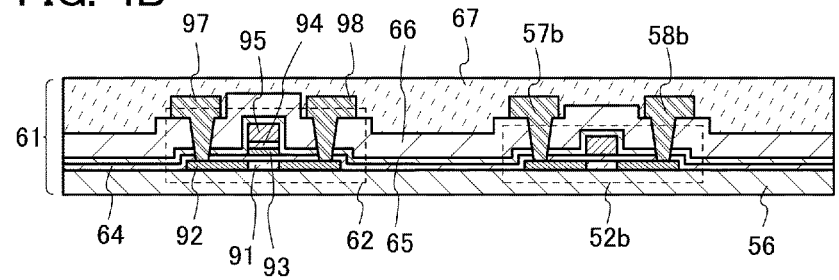

A memory element 62 shown in FIG. 4B is a nonvolatile memory element including a semiconductor layer having a channel formation region 91 and impurity regions 92, a tunnel oxide layer 64, a floating gate 93, a control insulating layer 94, and a control gate 95.

The tunnel oxide layer 64 can be formed from silicon oxide or formed to have a stacked-layer structure of silicon oxide and silicon nitride, with a thickness of 1 nm to 10 nm, preferably 1 nm to 5 nm, by a low pressure CVD method, a plasma CVD method, or the like. Further, the tunnel oxide layer can be formed by oxidizing or nitriding a semiconductor layer by plasma treatment. Furthermore, silicon oxide formed by a plasma CVD method may be oxidized or nitrided by plasma treatment. An insulating layer formed by the plasma treatment is dense, has high withstand voltage, and is excellent in reliability.

The floating gate 93 can be formed using a conductive layer, a polysilicon layer, a silicon dot, or the like. Instead of the floating gate, a charge storage layer formed from silicon nitride, germanium nitride, or the like may be used.

The control insulating layer 94 is formed of a single layer or a plurality of layers of silicon oxide, silicon nitride, silicon oxynitride, aluminum oxide, or the like by a low pressure CVD method, a plasma CVD method, or the like. The control insulating layer 94 is formed with a thickness of 1 nm to 20 nm, preferably 5 nm to 10 nm.

The control gate 95 may be formed using a material which is the same or substantially the same as the gate electrode 55a or the gate electrode 55b which is shown in FIG. 4A.

As a driving element for driving the memory element 62, the thin film transistor 52b may be formed.

After the memory element 62 and the thin film transistor 52b are formed, the insulating film 65 and the insulating film 66 are formed so as to cover the memory element 62 and the thin film transistor 52b. Over the insulating film 66, a wiring 97 and a wiring 98 which are electrically connected to the impurity regions 92 are formed. As for the thin film transistor 52b, the wirings 57b and 58b are formed as described above.

The insulating film 67 is formed so as to cover the insulating film 66, the wiring 97, the wiring 98, the wiring 57b, and the wiring 58b. Thus, a semiconductor element layer 61 including the memory element 62 is manufactured.

As memory elements, a nonvolatile memory element including a charge storage layer; a thin film transistor and a capacitor which is connected to the thin film transistor; a thin film transistor and a capacitor which is connected to the thin film transistor and includes a ferroelectric layer; an organic memory element in which an organic compound layer is interposed between a pair of electrodes; and the like are given, in addition to the structure of the memory element 62.

As semiconductor devices having such memory elements, memory devices such as DRAM (Dynamic Random Access Memory), SRAM (Static Random Access Memory), FeRAM (Ferroelectric Random Access Memory), mask ROM (Read Only Memory), EPROM (Electrically Programmable Read Only Memory), EEPROM (Electrically Erasable and Programmable Read Only Memory), and flash memory are given.

Figure 4C:
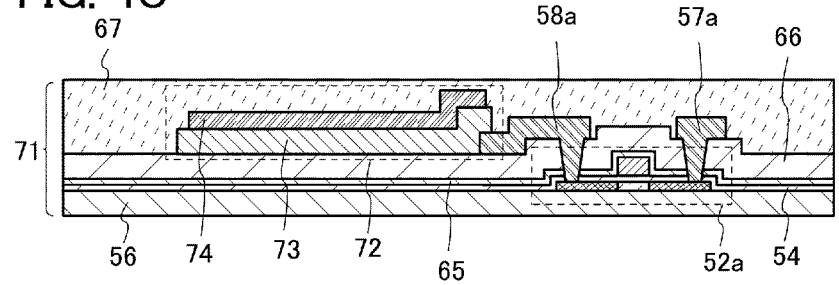

The photodiode 72 shown in FIG. 4C includes a wiring 58a serving as a first electrode, a light receiving portion 73, and a second electrode 74. The light receiving portion 73 can be formed of a semiconductor layer having amorphous or crystalline silicon. As typical examples of the semiconductor layer, a silicon layer, a silicon germanium layer, a silicon carbide layer, and a PN junction layer and a PIN junction layer of these layers are given.

The thin film transistor 52a is electrically connected to the photodiode 72 through the wiring 58a and serves as a driving element. Over the thin film transistor 52a, the insulating film 65 and the insulating film 66 are formed. Over the insulating film 66, the wiring 57a and the wiring 58a which are electrically connected to impurity regions of the thin film transistor 52a are formed. Further over the insulating film 66, the light receiving portion 73 which is electrically connected to the wiring 58a is formed, and over the light receiving portion 73, the second electrode 74 is formed.

The insulating film 67 is formed so as to cover the insulating film 66, the wiring 57a, the wiring 58a, the light receiving portion 73, and the second electrode 74. Thus, a semiconductor element layer 71 including the photodiode 72 and the thin film transistor 52a is manufactured.

As semiconductor devices including the photodiode 72 shown in FIG. 4C, an optical sensor, a solar cell, and the like are given.

Figure 4D:
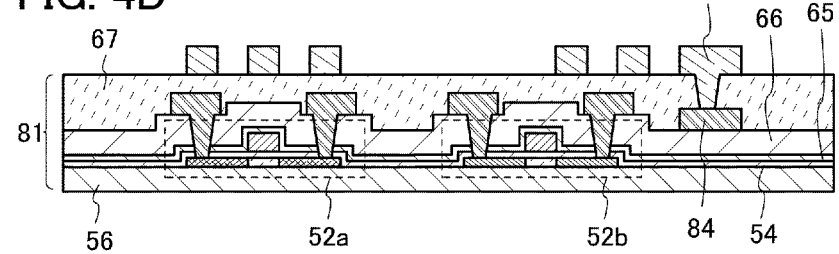

A semiconductor element layer 81 shown in FIG. 4D includes the thin film transistor 52a, the thin film transistor 52b, an electrode 84 which is formed over the insulating film 66 and electrically connected to the thin film transistor 52a or the thin film transistor 52b, and an antenna 83 which is formed over the insulating film 67 and electrically connected to the electrode 84. The electrode 84 may be formed using a material and a manufacturing step which are the same or substantially the same as those of the wiring 57a, the wiring 58a, the wiring 57b, or the wiring 58b which is electrically connected to the thin film transistor 52a or the thin film transistor 52b.

The antenna 83 shown in FIG. 4D is formed in such a manner that a droplet or paste which includes any one or more of metal particles of silver (Ag), gold (Au), copper (Cu), nickel (Ni), platinum (Pt), palladium (Pd), tantalum (Ta), molybdenum (Mo), titanium (Ti), and the like is discharged by a droplet discharge method (an ink-jet method, a dispenser method, or the like), and it is dried and baked. Forming the antenna by a droplet discharge method enables the number of steps and cost corresponding to the steps to be decreased.

Further, the antenna 83 may be formed by a screen printing method. In the case of using a screen printing method, as a material for the antenna 83, a conductive paste where conductive particles having a particle size of several nanometers to several tens of micrometers is dissolved or dispersed in an organic resin is selectively printed. As the conductive particles, one or more of metal particles such as silver (Ag), gold (Au), copper (Cu), nickel (Ni), platinum (Pt), palladium (Pd), tantalum (Ta), molybdenum (Mo), and titanium (Ti); fine particles of silver halide; or dispersible nanoparticles can be used. In addition, as the organic resin included in the conductive paste, one or more selected from organic resins functioning as a binder of metal particles, a solvent, a dispersing agent, or a coating material can be used. Typically, an organic resin such as an epoxy resin or a silicone resin can be used. Further, in forming the conductive layer, baking is preferably performed after the conductive paste is printed.

Alternatively, the antenna 83 may be formed using gravure printing or the like instead of a screen printing method or may be formed from a conductive material by a plating method, a sputtering method, or the like.

As typical examples of a semiconductor device having the semiconductor element layer 81 shown in FIG. 4D, an ID tag, an IC tag, an RF (radio frequency) tag, a wireless tag, an electronic tag, an RFID (radio frequency identification) tag, an IC card, an ID card, and the like, which can transmit and receive information wirelessly (hereinafter, referred to as an RFID) are given. Further, a semiconductor device of this embodiment includes an inlay in which an integrated circuit portion including a thin film transistor and the like and an antenna are sealed; and the inlay formed into a seal or card shape. Further, a method for electrically connecting objects which is described in this embodiment can be employed for a portion in which an antenna and an integrated circuit portion of RFID are to be connected to each other.

As a signal transmission method in RFID, an electromagnetic coupling method or an electromagnetic induction method (for example, 13.56 MHz band) is applied. In the case of utilizing electromagnetic induction caused by a change in magnetic flux density, the top view of the antenna can be a ring shape (for example, a loop antenna) or a spiral shape (for example, a spiral antenna).

Alternatively, a microwave method (for example, a UHF band (860 to 960 MHz band), a 2.45 GHz band, or the like) can be employed as the signal transmission method in RFID. In that case, the length, shape, or the like of the antenna may be appropriately set in consideration of a wavelength of an electromagnetic wave used for signal transmission.

Next, an example of using the semiconductor element layer 51 shown in FIG. 4A is described with reference to FIGS. 6A to 6D, FIGS. 7A to 7E, FIGS. 8A to 8D, FIGS. 9A to 9D, FIGS. 10A and 10B, FIGS. 11A and 11B, FIGS. 12A and 12B, FIG. 13, FIGS. 14A and 14B, FIGS. 15A and 15B, and FIG. 16.

First, a separation layer 112 is formed over a substrate 111 having an insulating surface.

As the substrate 111 having an insulating surface, a substrate which can withstand a temperature at which the semiconductor element layer 51 is formed is preferably used. Typically, a glass substrate, a quartz substrate, a ceramic substrate, a metal substrate in which an insulating layer is formed at least over one surface, an organic resin substrate, or the like can be used. Here, a glass substrate is used as the substrate 111 having an insulating surface.

Further, the substrate 111 needs to have a size with which alignment is easily performed, and further, the substrate 111 needs to be formed using a material with which alignment is easily performed. This is because arrangement of the semiconductor element layer 51 and another element layer which are to be superposed is performed over the substrate 111 in a later step.

The separation layer 112 is formed in such a manner that a layer having a thickness of 30 nm to 200 nm, which is made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing any of the elements described above as its main component; or a compound containing any of the elements described above as its main component, is formed by a sputtering method, a plasma CVD method, a coating method, a printing method, or the like to be a single layer or a plurality of stacked layers. The crystalline structure of a layer containing silicon may be any one of an amorphous state, a microcrystalline state, or a polycrystalline state. Here, a coating method is a method in which a solution is discharged on an object to form a film, and includes, for example, a spin coating method and a droplet discharging method. A droplet discharging method is a method in which a droplet of a composition containing particulates is discharged from a small hole to form a predetermined pattern.

When the separation layer 112 has a single layer structure, it is preferable to form a layer containing tungsten, a layer containing molybdenum, or a layer containing mixture of tungsten and molybdenum. Alternatively, a layer containing an oxide or oxynitride of tungsten, a layer containing an oxide or oxynitride of molybdenum, or a layer containing an oxide or oxynitride of mixture of tungsten and molybdenum is formed. Note that the mixture of tungsten and molybdenum corresponds to an alloy of tungsten and molybdenum, for example.

In the case where the separation layer 112 has a stacked-layer structure, preferably, a metal layer is formed as a first layer, and a metal oxide layer is formed as a second layer. Typically, a layer containing tungsten, molybdenum, or a mixture of tungsten and molybdenum is formed as the metal layer of the first layer. As the second layer, a layer containing an oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; or a nitride oxide of tungsten, molybdenum, or a mixture of tungsten and molybdenum is formed.

When the separation layer 112 has a stacked-layer structure in which a metal layer is formed as the first layer and a metal oxide layer is formed as the second layer, the stacked-layer structure may be formed by utilizing the following: a layer containing tungsten is formed as the metal layer, and an insulating layer made of an oxide is formed thereover, whereby a layer containing an oxide of tungsten is formed as the metal oxide layer at the interface between the layer containing tungsten and the insulating layer. Moreover, the metal oxide layer may be formed in such a manner that a surface of the metal layer is subjected to thermal oxidation treatment, oxygen plasma treatment, treatment using a solution having strong oxidizability such as ozone water, or the like.

Examples of an oxide of tungsten include $WO_2$, $W_2O_5$, $W_4O_{11}$, and $WO_3$.

Although the separation layer 112 is formed to be in contact with the substrate 111 having an insulating surface in accordance with the above process, the present invention is not limited to the process. An insulating layer to be a base may be formed so as to be in contact with the substrate 111 having an insulating surface, and the separation layer 112 may be provided to be in contact with the insulating layer. Here, as the separation layer 112, a tungsten layer with a thickness of 30 nm to 70 nm is formed by a sputtering method.

Over the separation layer 112, the insulating film 56 serving as a base layer is formed. Over the insulating film 56, an island-like semiconductor film 161 including the impurity regions 53a and the channel formation region 63a, and an island-like semiconductor film 162 including the impurity regions 53b and the channel formation region 63b are formed. The gate insulating film 54 is formed so as to cover the island-like semiconductor film 161 and the island-like semiconductor film 162. Further, the gate electrode 55a is formed in a portion over the gate insulating film 54 and also over the channel formation region 63a, and the gate electrode 55b is formed in a portion over the gate insulating film 54 and also over the channel formation region 63b (see FIG. 6A).

Note that an impurity element imparting one conductivity type to be added to the impurity regions 53a is added using the gate electrode 55a as a mask. Further, an impurity element imparting one conductivity type to be added to the impurity regions 53b is added using the gate electrode 55b as a mask. The impurity elements added to the impurity regions 53a and the impurity regions 53b may be the same or be opposite in conductivity to each other.

Figure 6A:
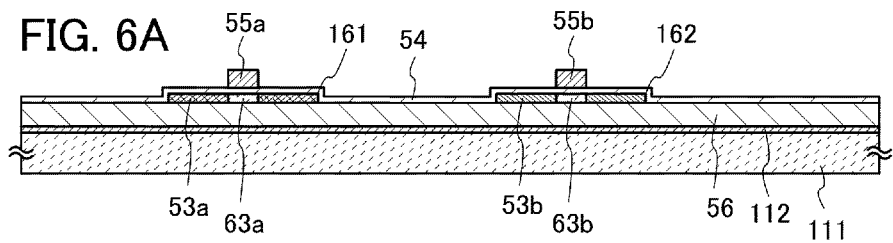
FIGS. 6A to 6D are cross-sectional views illustrating a manufacturing process of a semiconductor circuit element.
Figure 6B:
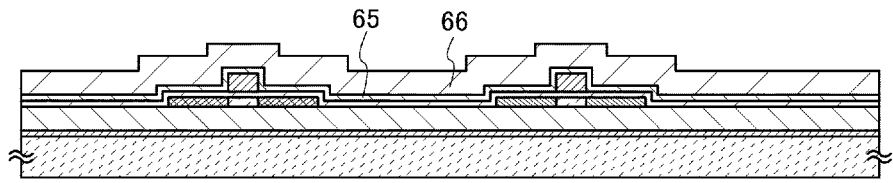
Figure 6C:
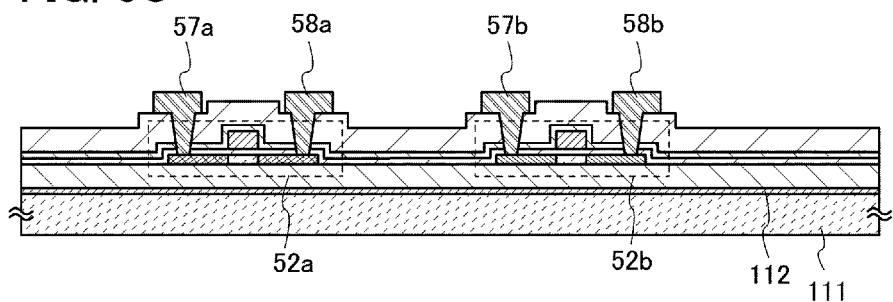

Then, the insulating film 65 is formed so as to cover the gate insulating film 54, the gate electrode 55a, and the gate electrode 55b, and the insulating film 66 is formed over the insulating film 65 (see FIG. 6B).

The insulating film 65 may be formed using a silicon nitride film, for example. The insulating film 66 may be formed using any one of a silicon oxide film, a silicon nitride film, a silicon nitride film containing oxygen, or a silicon oxide film containing nitrogen; or a stacked layer film in which two or more films thereof are stacked. Alternatively, the insulating film 66 may be formed using an organic insulating film.

The wiring 57a and the wiring 58a which are electrically connected to the impurity regions 53a in the island-like semiconductor film 161 are formed over the insulating film 66. Further, the wiring 57b and the wiring 58b which are electrically connected to the impurity regions 53b in the island-like semiconductor film 162 are formed over the insulating film 66 (see FIG. 6C).

Then, the insulating film 67 is formed so as to cover the insulating film 66, the wiring 57a, the wiring 58a, the wiring 57b, and the wiring 58b. The insulating film 67 may be formed using any one of a silicon oxide film, a silicon nitride film, a silicon nitride film containing oxygen, or a silicon oxide film containing nitrogen; or a stacked layer film in which two or more films thereof are stacked. Alternatively, the insulating film 67 may be formed using an organic insulating film.

Figure 6D:
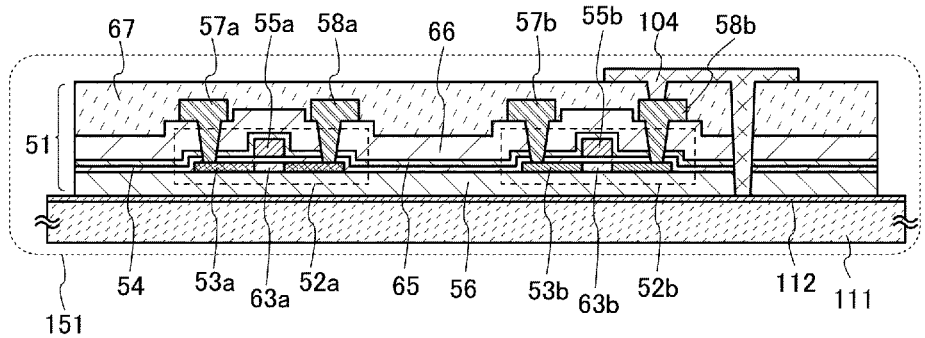

Next, a wiring 104 which is electrically connected to the wiring 58b is formed over the insulating film 67 (see FIG. 6D). The wiring 104 may be formed using a material which is the same or substantially the same as that of the wiring 58b. The wiring 104 is also referred to as a bump and has a function of electrically connecting the semiconductor element layer 51 to a conductive resin 101 to be formed later. In this embodiment, the substrate 111, the separation layer 112, and the semiconductor element layer 51 are collectively referred to as a semiconductor circuit element 151.

The wiring 104 is formed so as to reach the separation layer 112. Accordingly, when the semiconductor element layer 51 is separated and another element layer is arranged to be superposed in a later step, the semiconductor element layer 51 and another element layer can be electrically connected to each other.

After or before the wiring 104 is formed, the edge portions of the insulating film 56, the gate insulating film 54, the insulating film 65, the insulating film 66, and the insulating film 67 are etched, so that the separation layer 112 is exposed. By exposing the separation layer 112, a plurality of superposed element layers can be easily separated in a later step.

Figure 7A:
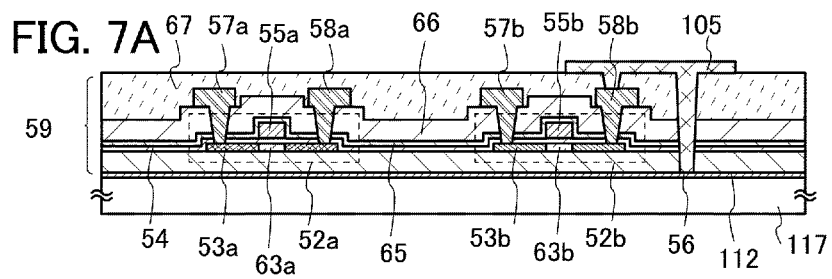
FIGS. 7A to 7E are cross-sectional views illustrating a manufacturing process of a semiconductor circuit element.

Then, in accordance with manufacturing steps shown in FIGS. 6A to 6D, a substrate 117, a separation layer 112, and a semiconductor element layer 59 having a wiring 105 are formed (see FIG. 7A). As the substrate 117, a substrate the same or substantially the same as the substrate 111 may be used. As the wiring 105, a wiring the same as the wiring 104 or a wiring different from the wiring 104 may be used. Also, as the semiconductor element layer 59, a layer the same as the semiconductor element layer 51 or a semiconductor element layer different from the semiconductor element layer 51 be used. Note that the edge portions of the insulating film 56, the gate insulating film 54, the insulating film 65, the insulating film 66, and the insulating film 67 do not need to be etched.

Figure 7B:
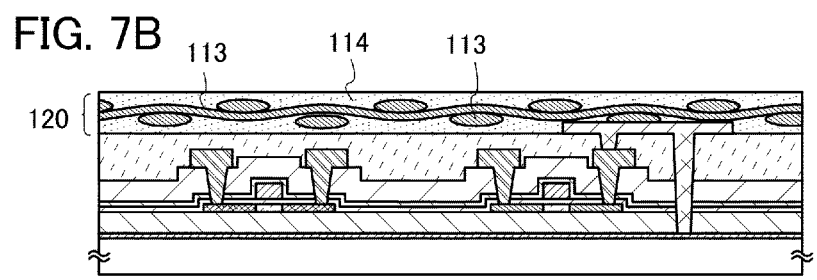

Then, the structure body 120 in which the sheet-like fiber body 113 is impregnated with the organic resin 114 is provided over the insulating film 67 and the wiring 104 (see FIG. 7B). Such a structure body 120 is also called a prepreg. A prepreg is specifically formed in such a manner that, after a sheet-like fiber body is impregnated with a composition in which a matrix resin is diluted with an organic solvent, drying is performed so that the organic solvent is volatilized and the matrix resin is semi-cured.

In the drawings of this specification, as the sheet-like fiber body 113, a woven fabric which is plain-woven using a yarn bundle having an elliptical shape in its cross section is shown. Although the size of the thin film transistor 52a and the thin film transistor 52b is larger than that of a yarn bundle of the sheet-like fiber body 113, the size of the thin film transistor 52a and the thin film transistor 52b may be smaller than that of a yarn bundle of the sheet-like fiber body 113.

Figure 7C:
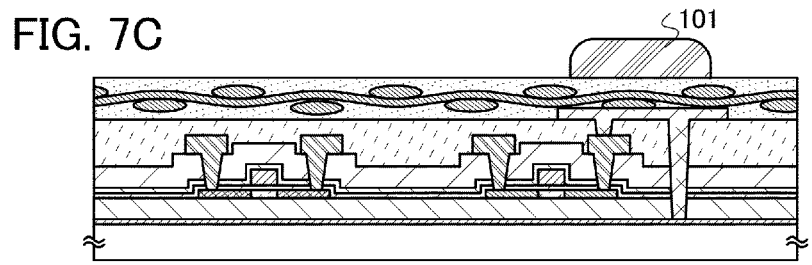
Figure 7D:
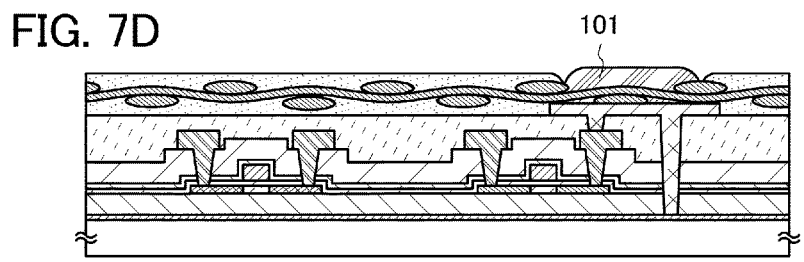

Then, the conductive resin 101 is provided in a portion over the structure body 120 and also over the wiring 105 (see FIG. 7C). In this embodiment, conductive paste containing a metal element, for example, silver paste is used as the conductive resin 101. The metal element may be contained as a metal particle.

The conductive paste may be any as long as it is paste including any of copper (Cu), silver (Ag), nickel (Ni), gold (Au), platinum (Pt), palladium (Pd), tantalum (Ta), molybdenum (Mo), or titanium (Ti).

As the method of providing the conductive resin 101 over the structure body 120, a screen printing method or an ink-jet method may be employed.

When the conductive resin 101 is provided over the structure body 120, the organic resin 114 in the structure body 120 reacts with a component of the conductive resin 101 and, for example, in the case of using conductive paste, the organic resin 114 reacts with the paste. Then, part of the organic resin 114 is dissolved and metal particles in the conductive resin 101 pass through interstices in the sheet-like fiber body 113 and move to a surface (a second surface) opposite to a surface over which the conductive resin 101 is provided first (a first surface). Accordingly, a through electrode is formed in the structure body 120 (see FIG. 7D). Note that the area of the conductive resin 101 on the second surface of the structure body 120 may be larger or smaller than the area on the first surface. That is, the conductive resin 101 may contract or expand when moving in the structure body 120.

By not forming a through hole (also referred to as a contact hole) in the structure body 120, that is, by not dividing the sheet-like fiber body 113, one surface of the structure body 120 can be electrically connected to the other surface; accordingly, the strength of the structure body 120 can be maintained.

Figure 7E:
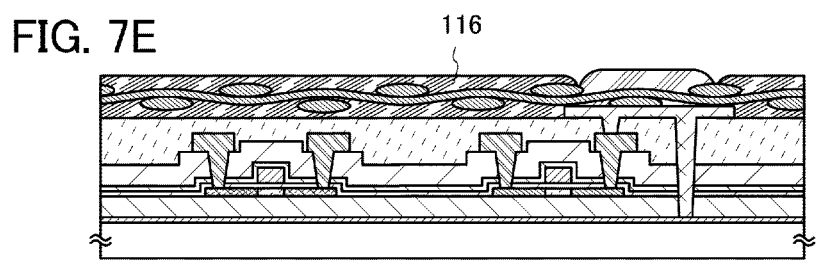

After that, a heating step and a pressure bonding step are performed to cure the organic resin 114 which is in the structure body 120 and which is not dissolved (see FIG. 7E). In this embodiment, a cured organic resin is referred to as an organic resin 116. In the case where the organic resin 114 is an organic plastic resin, the organic resin 114 which is plasticized is then cured by cooling to room temperature.

Figure 8A:
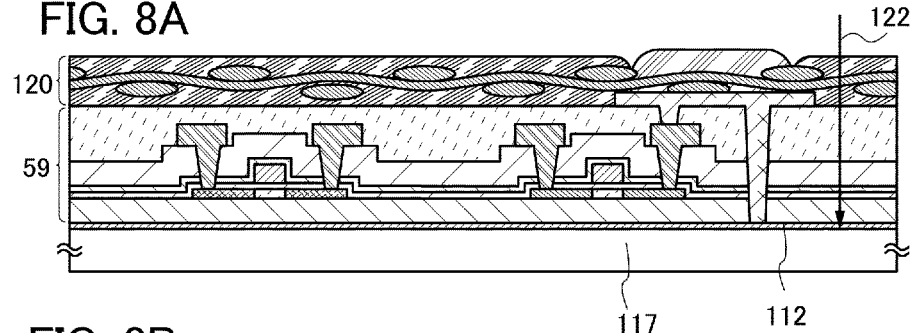
FIGS. 8A to 8D are cross-sectional views illustrating a manufacturing process of a semiconductor circuit element.
Figure 8B:
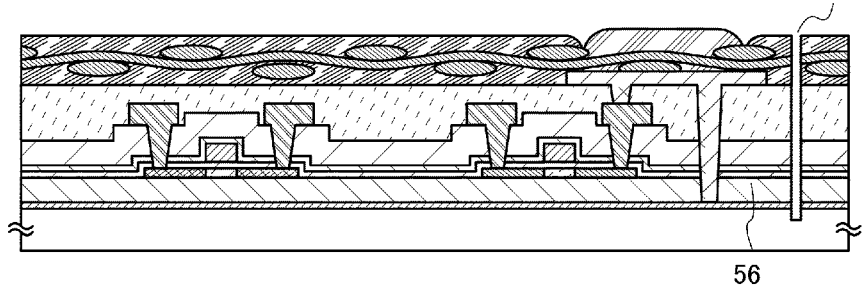

Next, in order to facilitate a subsequent separation step, by irradiating the structure body 120, the semiconductor element layer 59, and the separation layer 112 with a laser beam 122 from the side of the structure body 120 as shown in FIG. 8A, a groove 123 as shown in FIG. 8B may be formed. As the laser beam used for forming the groove 123, a laser beam with a wavelength which is absorbed by any of layers included in the separation layer 112, the semiconductor element layer 59, or the structure body 120 is preferably used. Typically, a laser beam in the ultraviolet region, visible region, or infrared region is appropriately selected for irradiation.

As a laser capable of emitting such a laser beam, the following can be used: an excimer laser such as a KrF excimer laser, an ArF excimer laser, or a XeCl excimer laser; a gas laser such as a He laser, a He—Cd laser, an Ar laser, a He—Ne laser, an HF laser, or a $CO_2$ laser; a solid-state laser such as a crystal laser in which a crystal such as YAG, $GdVO_4$, $YVO_4$, YLF, or $YAlO_3$ is doped with Cr, Nd, Er, Ho, Ce, Co, Ti, or Tm, a glass laser, or a ruby laser; or a semiconductor laser such as a GaN laser, a GaAs laser, a GaAlAs laser, or an InGaAsP laser can be used. In a case of using a solid-state laser, any of the fundamental wave to the fifth harmonic wave is preferably used.

Figure 8C:
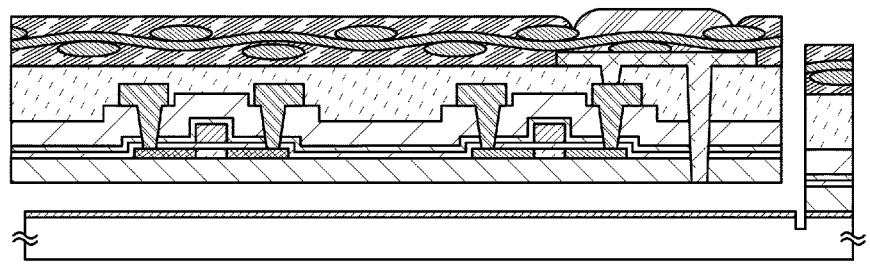
Figure 8D:
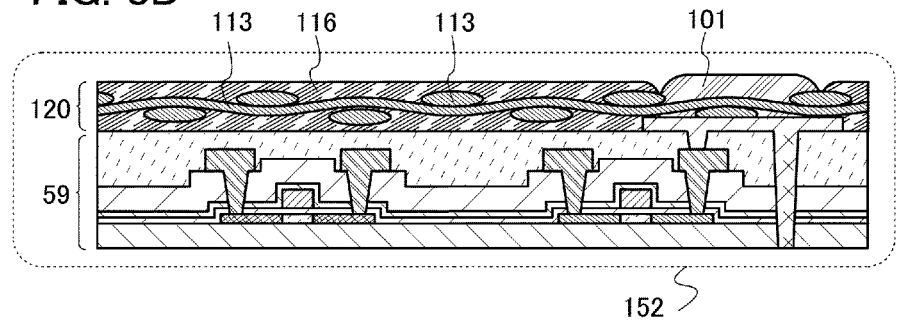

Next, as illustrated in FIG. 8C, by using the groove 123 as a trigger, part of the semiconductor element layer 59 and part of the structure body 120 are separated from the substrate 117 having an insulating surface over which the separation layer 112 is formed, by a physical means at the interface between the separation layer 112 and the insulating film 56. In this embodiment, the part of the semiconductor element layer 59 and the part of the structure body 120 which have been separated are collectively referred to as a semiconductor circuit element 152 (see FIG. 8D).

The physical means refers to a dynamic means or a mechanical means, for example, a means for applying some dynamical energy (mechanical energy). Typically, the physical means is to apply mechanical force (e.g., a peeling process with human hands or with a gripper, or a separation process by rotating a roller). At this time, when an adhesive sheet which can be separated by light or heat is provided over a surface of the structure body 120, separation can be easily performed.

Further, the semiconductor element layer 59 may be separated from the separation layer 112 after a liquid is dropped into the groove 123 to allow the liquid to be infiltrated into the interface between the separation layer 112 and the insulating film 56. In this case, a liquid may be dropped only into the groove 123, or the substrate 117 having an insulating surface, the semiconductor element layer 59, and the structure body 120 may be wholly soaked in a liquid so that the liquid may be infiltrated from the groove 123 into the interface between the separation layer 112 and the semiconductor element layer 59.

Alternatively, in FIG. 8B, a method can be employed in which a fluoride gas such as $NF_3$, $BrF_3$, or $ClF_3$ is introduced into the groove 123, and the separation layer is removed by etching with the use of the fluoride gas so that part of the semiconductor element layer 59 is separated from the substrate 117 having an insulating surface.

In the above-described manner, a semiconductor device can be obtained in which the semiconductor element layer 59 formed in contact with one surface of the structure body 120 is electrically connected to a terminal, a wiring, a circuit, another semiconductor element, or the like which is formed on the other surface of the structure body 120 without forming a through hole in the structure body 120.

In the case where a plurality of semiconductor devices are included in the semiconductor element layer 59, the plurality of semiconductor devices may be obtained by dividing the semiconductor element layer 59 and the structure body 120. With such a step, a plurality of semiconductor devices can be manufactured.

When a plurality of semiconductor devices is manufactured by dividing the semiconductor element layer 59 and the structure body 120, selective division is possible by dicing, scribing, using a cutting machine having an edged tool such as scissors or a knife, laser cutting, or the like.

Figure 10A:
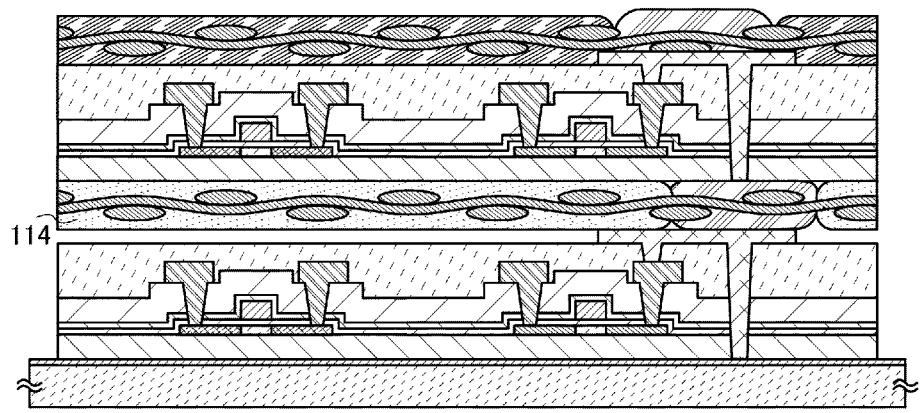
FIGS. 10A and 10B are cross-sectional views illustrating a manufacturing process of a semiconductor circuit element.
Figure 10B:
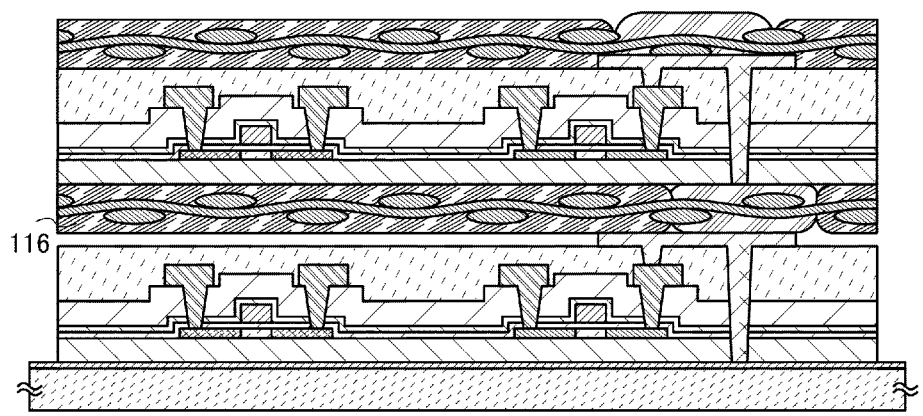
Figure 11A:
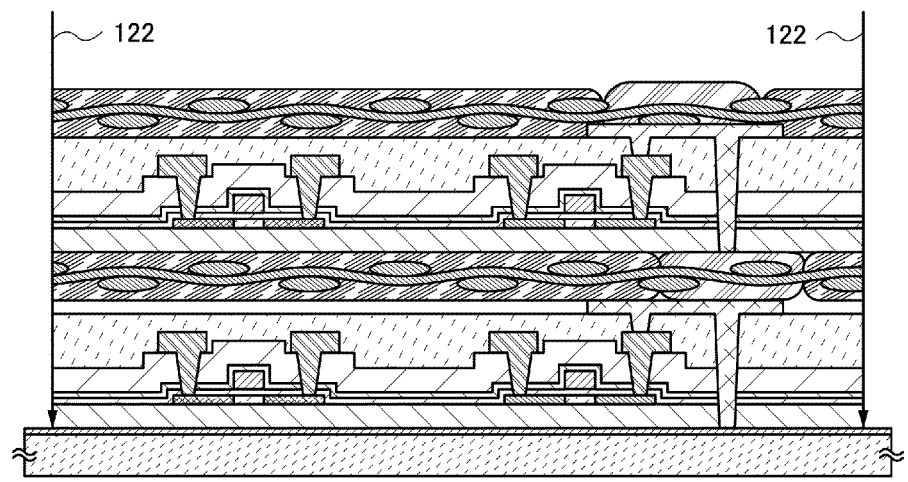
FIGS. 11A and 11B are cross-sectional views illustrating a manufacturing process of a semiconductor circuit element.
Figure 11B:
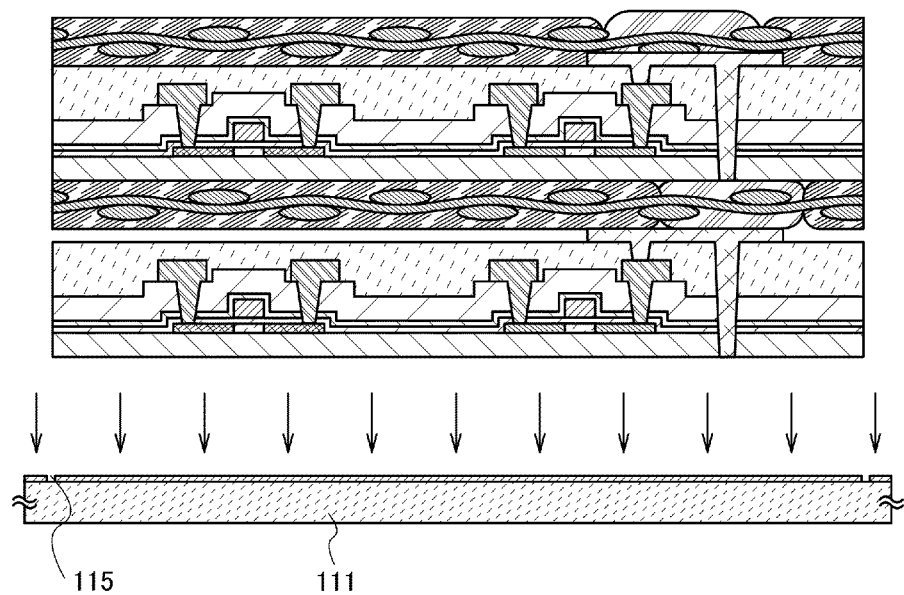
Figure 14:
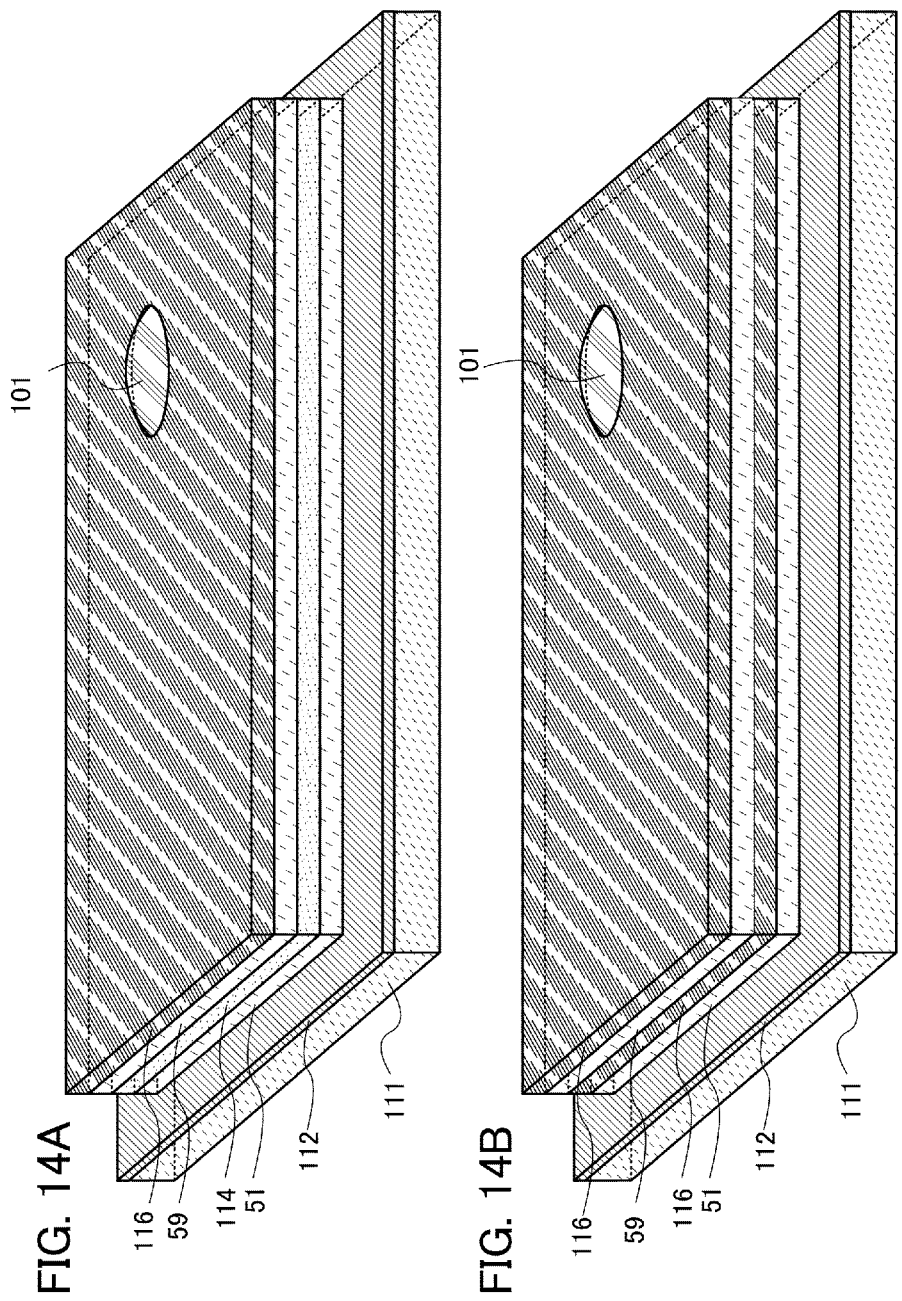
FIGS. 14A and 14B are perspective views illustrating a manufacturing process of a semiconductor circuit element.
Figure 15:
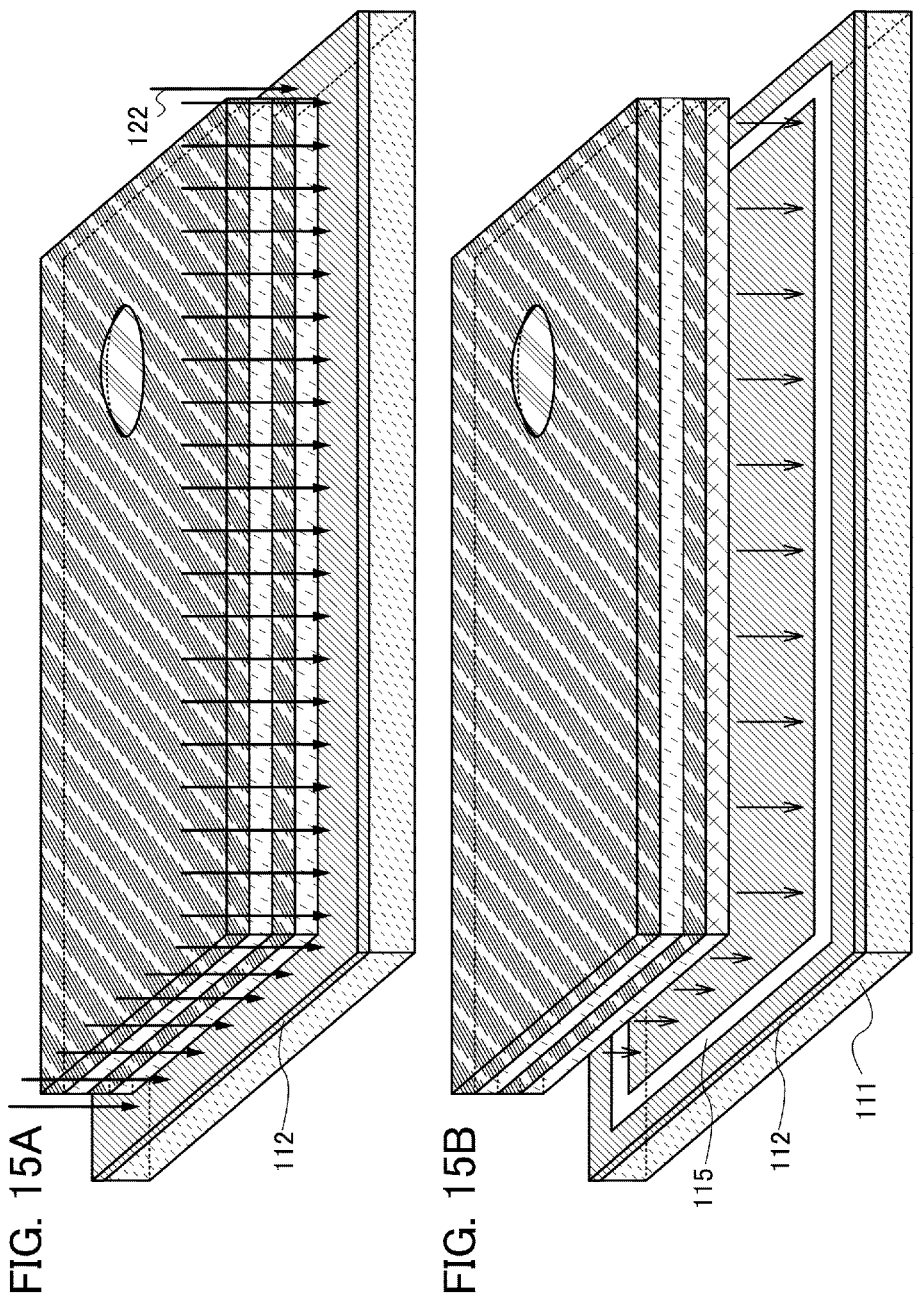
FIGS. 15A and 15B are perspective views illustrating a manufacturing process of a semiconductor circuit element.
Figure 16:
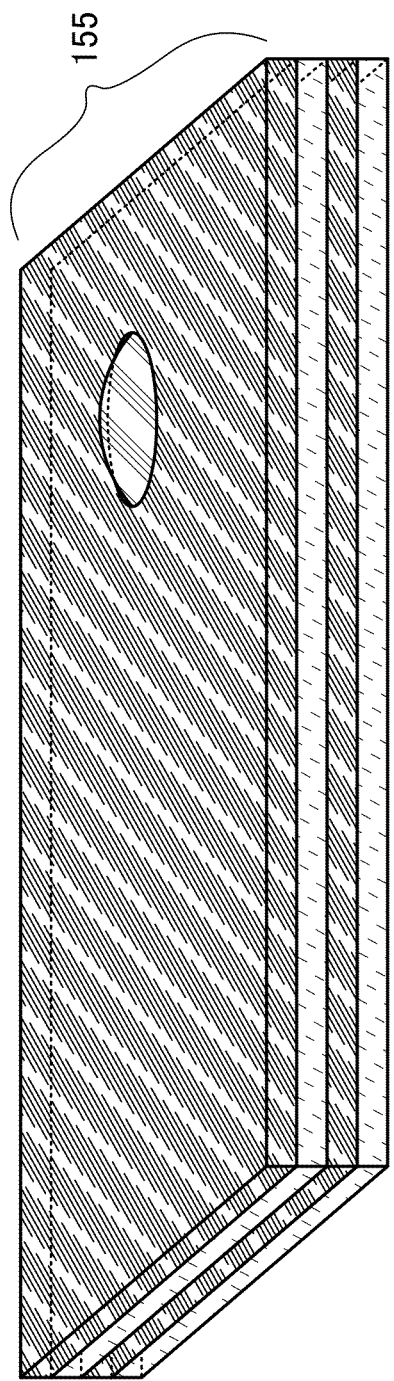
FIG. 16 is a perspective view illustrating a manufacturing process of a semiconductor circuit element.

Here, a fixing sheet 153 for fixing the semiconductor circuit element 151 and the semiconductor circuit element 152 is described with reference to FIGS. 9A to 9D, FIGS. 10A and 10B, FIGS. 11A and 11B, FIGS. 12A and 12B, FIG. 13, FIGS. 14A and 14B, FIGS. 15A and 15B, and FIG. 16. Note that FIG. 13 is a perspective view of FIG. 9D, FIG. 14A is a perspective view of FIG. 10A, FIG. 14B is a perspective view of FIG. 10B, FIG. 15A is a perspective view of FIG. 11A, FIG. 15B is a perspective view of FIG. 11B, and FIG. 16 is a perspective view of FIG. 12A.

First, the structure body 121 in which the sheet-like fiber body 113 is impregnated with the organic resin 114 which is not cured is prepared (see FIG. 9A). As the structure body 121, a structure body the same as the structure body 120 or a structure body different from the structure body 120 may be used. The conductive resin 201 is provided over the organic resin 114 so as to be aligned with the wiring 104 of the semiconductor circuit element 151 and the conductive resin 101 and the wiring 105 of the semiconductor circuit element 152 which are bonded together in a later step (see FIG. 9B) As the conductive resin 201, a conductive resin the same as the s conductive resin 101 or a conductive resin different from the conductive resin 101 may be used.

When the conductive resin 201 is provided over the organic resin 114 which is not cured, the organic resin 114 reacts with a component of the conductive resin 201. For example, in the case of using conductive paste, the organic resin 114 reacts with the paste. Then, part of the organic resin 114 is dissolved and metal particles in the conductive resin 201 pass through interstices in the sheet-like fiber body 113 and move to a surface (a second surface) opposite to a surface over which the conductive resin 201 is provided first (a first surface). Accordingly, a conductive region is formed in the structure body 121 (see FIG. 9C). In this embodiment, the structure shown in FIG. 9C is referred to as a fixing sheet 153.

Figure 13:
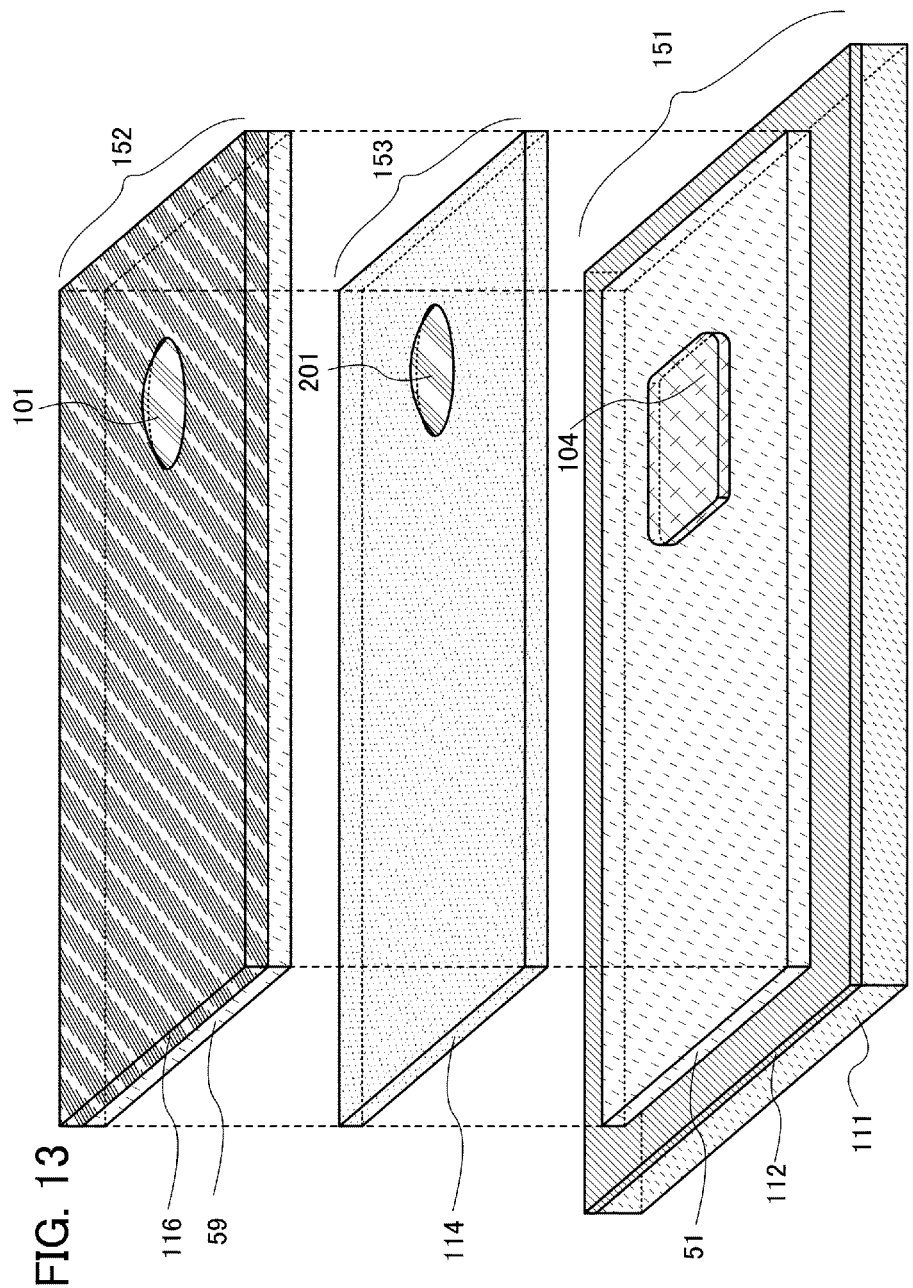
FIG. 13 is a perspective view illustrating a manufacturing process of a semiconductor circuit element.

Then, the semiconductor circuit element 151, the fixing sheet 153, and the semiconductor circuit element 152 are aligned (see FIG. 9D and FIG. 13). The fixing sheet 153 and the semiconductor circuit element 152 are bonded onto the substrate 111 of the semiconductor circuit element 151; therefore, alignment is easily performed.

Further, the semiconductor circuit element 151, the fixing sheet 153, and the semiconductor circuit element 152 are superposed so that the wiring 104 of the semiconductor circuit element 151, conductive resin 201 of the fixing sheet 153, and the wiring 105 and the conductive resin 101 of the semiconductor circuit element 152 are aligned and the wirings 104 and 105 and the conductive resins 101 and 201 are electrically connected to each other when the semiconductor circuit element 151, the semiconductor circuit element 152, and the fixing sheet 153 are fixed together in a later step.

After the semiconductor circuit element 151, the fixing sheet 153, and the semiconductor circuit element 152 are aligned, they are attached together (see FIG. 10A and FIG. 14A). Note that the semiconductor circuit element 151, the fixing sheet 153, and the semiconductor circuit element 152 are not fixed at this time because the organic resin 114 of the fixing sheet 153 is not cured.

Then, heat treatment is performed, whereby the organic resin 114 of the fixing sheet 153 is cured, so that the organic resin 114 becomes the organic resin 116. By this, the semiconductor circuit element 151, the fixing sheet 153, and the semiconductor circuit element 152 are bonded together (see FIG. 10B and FIG. 14B).

Then, the exposed separation layer 112 of the semiconductor circuit element 151 is irradiated with the laser beam 122 (see FIG. 11A and FIG. 15A).

By the irradiation of the separation layer 112 with the laser beam 122, a groove 115 is formed. By using the groove 115 as a trigger, the substrate 111 is separated by a physical means (see FIG. 11B and FIG. 15B).

Figure 12A:
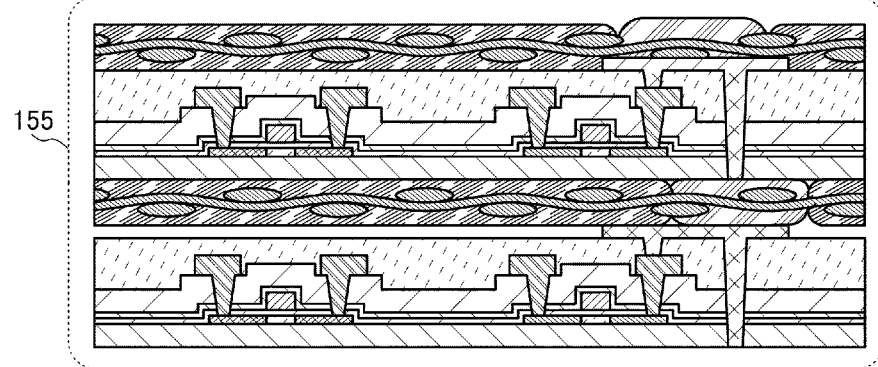
FIGS. 12A and 12B are cross-sectional views illustrating a manufacturing process of a semiconductor circuit element.
Figure 12B:
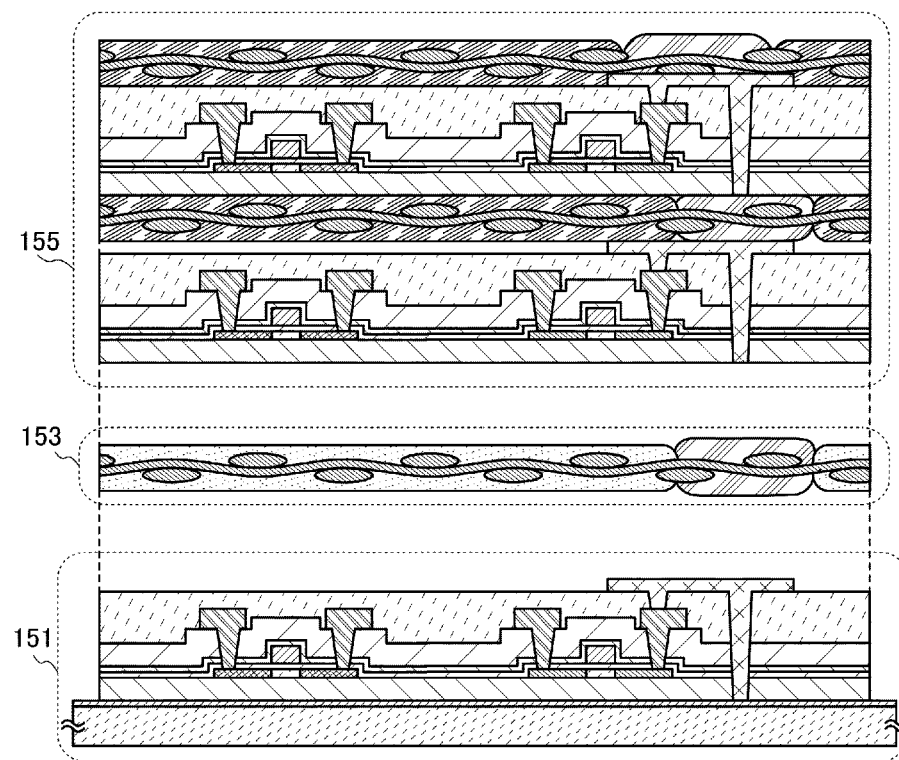

In the above-described manner, a semiconductor circuit element 155 having a stacked structure is manufactured (see FIG. 12A and FIG. 16). In the case where another semiconductor element layer is stacked onto the semiconductor circuit element 155, the semiconductor circuit element 151 having the substrate 111, the fixing sheet 153 having an organic resin which is not cured, and the semiconductor circuit element 155 are superposed on one another, and the organic resin of the fixing sheet 153 is cured, whereby the semiconductor circuit element 151, the fixing sheet 153, and the semiconductor circuit element 155 may be bonded together (see FIG. 12B).

According to this embodiment, a highly integrated semiconductor circuit element can be obtained. A plurality of semiconductor circuit elements is bonded together over the substrate 111 which serves as the reference of alignment. Therefore, alignment can be performed with improved accuracy.

This application is based on Japanese Patent Application serial no. 2008-179286 filed with Japan Patent Office on Jul. 9, 2008, the entire contents of which are hereby incorporated by reference.

What is claimed is:
1. A method for manufacturing a semiconductor device comprising the steps of:
    forming a first semiconductor circuit element having a first semiconductor element and a first wiring electrically connected to the first semiconductor element, over a substrate;
    forming a second semiconductor circuit element having a second semiconductor element, a second wiring electrically connected to the second semiconductor element, and a first structure body comprising a first sheet-like fiber body, a first organic resin, and a first electrode which penetrates into the first structure body and is electrically connected to the second wiring;
    forming a fixing sheet having a second structure body comprising a second sheet-like fiber body, a second organic resin which is not cured, and a second electrode which penetrates into the second structure body;

disposing the first semiconductor circuit element, the fixing sheet, and the second semiconductor circuit element so that the first wiring, the second electrode, and the second wiring are superposed on one another over the substrate;

fixing the first semiconductor circuit element, the fixing sheet, and the second semiconductor circuit element by curing the second organic resin of the fixing sheet; and separating the substrate from the first semiconductor circuit element, the fixing sheet, and the second semiconductor circuit element which are fixed.

2. The method for manufacturing a semiconductor device according to claim 1, wherein each of the first electrode and the second electrode comprises metal particles selected from at least one of copper (Cu), silver (Ag), nickel (Ni), gold (Au), platinum (Pt), palladium (Pd), tantalum (Ta), molybdenum (Mo), and titanium (Ti).

3. The method for manufacturing a semiconductor device according to claim 1, wherein each of the first sheet-like fiber body and the second sheet-like fiber body includes glass fiber.

4. A method for manufacturing a semiconductor device comprising the steps of:

forming a first semiconductor element layer electrically connected to a first wiring, over a substrate;

forming a second semiconductor element layer electrically connected to a second wiring;

preparing a first structure body including a first sheet-like fiber body and a first organic resin which is not cured, on the second semiconductor element layer and the second wiring;

forming a first electrode which penetrates into the first structure body and is electrically connected to the second wiring by disposing a first conductive resin having first metal particles on the first organic resin, dissolving the first organic resin by the first conductive resin, and by moving the first metal particles in interstices in the first sheet-like fiber body;

fixing the first structure body to the second semiconductor element layer by curing the first organic resin;

preparing a second structure body including a second sheet-like fiber body and a second organic resin which is not cured;

forming a second electrode which penetrates into the second structure body by disposing a second conductive resin having second metal particles on the second organic resin, dissolving the second organic resin by the second conductive resin, and by moving the second metal particles in interstices in the second sheet-like fiber body;

disposing the first semiconductor element layer, the second structure body, and the second semiconductor element layer with the first structure body so that the first wiring, the second electrode, the second wiring, and the first electrode are superposed on one another over the substrate;

fixing the first semiconductor element layer, the second structure body, and the second semiconductor element layer with the first structure body by curing the second organic resin of the second structure body; and separating the substrate from the first semiconductor element layer, the second structure body, and the second semiconductor element layer with the first structure body which are fixed.

5. The method for manufacturing a semiconductor device according to claim 4, wherein each of the first metal particles and the second metal particles include at least one of copper (Cu), silver (Ag), nickel (Ni), gold (Au), platinum (Pt), palladium (Pd), tantalum (Ta), molybdenum (Mo), and titanium (Ti).

6. The method for manufacturing a semiconductor device according to claim 4, wherein each of the first sheet-like fiber body and the second sheet-like fiber body includes glass fiber.

7. A method for manufacturing a semiconductor device comprising the steps of:

forming a first element layer having a first semiconductor element and a first wiring electrically connected to the first semiconductor element;

forming a second element layer having a second semiconductor element and a second wiring electrically connected to the second semiconductor element;

forming a fixing sheet having a structure body comprising a sheet-like fiber body, an organic resin which is not cured, and an electrode which penetrates into the structure body;

putting the fixing sheet between the first element layer and the second element layer so that the first wiring, the electrode, and the second wiring are superposed on one another and electrically connected; and fixing the first element layer, the fixing sheet, and the second element layer by curing the organic resin of the fixing sheet.

8. The method for manufacturing a semiconductor device according to claim 7, wherein the electrode comprises metal particles selected from at least one of copper (Cu), silver (Ag), nickel (Ni), gold (Au), platinum (Pt), palladium (Pd), tantalum (Ta), molybdenum (Mo), and titanium (Ti).

9. The method for manufacturing a semiconductor device according to claim 7, wherein the sheet-like fiber body includes glass fiber.

10. The method for manufacturing a semiconductor device according to claim 7, wherein the curing the organic resin of the fixing sheet is performed by heat treatment.

11. A method for manufacturing a semiconductor device comprising the steps of:

forming a first element layer having a first semiconductor element and a first wiring electrically connected to the first semiconductor element;

forming a second element layer having a second semiconductor element and a second wiring electrically connected to the second semiconductor element;

forming a fixing sheet having a structure body comprising a sheet-like fiber body and an organic resin which is not cured;

providing a conductive resin comprising conductive paste and metal particles on a surface of the structure body to form an electrode penetrating into the structure body without dividing the sheet-like fiber body;

putting the fixing sheet between the first element layer and the second element layer so that the first wiring, the electrode, and the second wiring are superposed on one another and electrically connected; and fixing the first element layer, the fixing sheet, and the second element layer by curing the organic resin of the fixing sheet.

12. The method for manufacturing a semiconductor device according to claim 11, wherein the electrode comprises metal particles selected from at least one of copper (Cu), silver (Ag), nickel (Ni), gold (Au), platinum (Pt), palladium (Pd), tantalum (Ta), molybdenum (Mo), and titanium (Ti).

13. The method for manufacturing a semiconductor device according to claim 11, wherein the sheet-like fiber body includes glass fiber.

14. The method for manufacturing a semiconductor device according to claim 11, wherein the curing the organic resin is performed by heat treatment.

15. A method for manufacturing a semiconductor device comprising the steps of:
- preparing a structure body comprising a sheet-like fiber body and an organic resin;
- providing a conductive resin comprising conductive paste and metal particles on a first surface of the structure body, thereby dissolving a part of the organic resin in the structure body by reacting the organic resin with the conductive paste in the conductive resin, so that metal particles in the conductive resin pass through interstices in the sheet-like fiber body and an electrode is formed from the first surface to a second surface of the structure body without dividing the sheet-like fiber body; and
- bonding an element layer to the structure body having the electrode by curing the organic resin.

16. The method for manufacturing a semiconductor device according to claim 15, wherein the electrode comprises metal particles selected from at least one of copper (Cu), silver (Ag), nickel (Ni), gold (Au), platinum (Pt), palladium (Pd), tantalum (Ta), molybdenum (Mo), and titanium (Ti).

17. The method for manufacturing a semiconductor device according to claim 15, wherein the sheet-like fiber body includes glass fiber.

18. The method for manufacturing a semiconductor device according to claim 15, wherein the curing the organic resin is performed by heat treatment.

* * * * *